US010848112B2

(12) United States Patent
Geha et al.

(10) Patent No.: US 10,848,112 B2
(45) Date of Patent: Nov. 24, 2020

(54) LOW NOISE AMPLIFIER

(71) Applicant: Qatar Foundation for Education, Science and Community Development, Doha (QA)

(72) Inventors: Chadi Daher Geha, Doha (QA); Jose Silva-Martinez, Doha (QA); Cam V. Nguyen, Doha (QA)

(73) Assignee: Qatar Founation for Education, Science, and Community Development, Doha (QA)

( * ) Notice: Subject to any disclaimer, the term of this patent is extended or adjusted under 35 U.S.C. 154(b) by 59 days.

(21) Appl. No.: 15/770,729

(22) PCT Filed: Oct. 31, 2016

(86) PCT No.: PCT/GB2016/053372
§ 371 (c)(1),
(2) Date: Apr. 24, 2018

(87) PCT Pub. No.: WO2017/072533
PCT Pub. Date: May 4, 2017

(65) Prior Publication Data
US 2019/0074802 A1 Mar. 7, 2019

(30) Foreign Application Priority Data

Oct. 30, 2015 (GB) .................................. 1519262.8
Oct. 30, 2015 (GB) .................................. 1519263.6
(Continued)

(51) Int. Cl.
H03F 3/217 (2006.01)
H03F 3/26 (2006.01)
(Continued)

(52) U.S. Cl.
CPC ................. *H03F 3/26* (2013.01); *H03F 1/22* (2013.01); *H03F 1/42* (2013.01); *H03F 1/565* (2013.01);
(Continued)

(58) Field of Classification Search
CPC ... H03F 3/26; H03F 1/22; H03F 3/191; H03F 1/565; H03F 1/42
(Continued)

(56) References Cited

U.S. PATENT DOCUMENTS

| 6,366,171 B1 | 4/2002 | Litmanen et al. | |
|---|---|---|---|
| 2004/0145415 A1* | 7/2004 | Sun ........................... | H03F 1/26 330/295 |
| 2012/0280754 A1* | 11/2012 | Gorbachov ............. | H03F 1/565 330/302 |

OTHER PUBLICATIONS

International Search Report and Written Opinion for PCT/GB2016/053372 dated Feb. 1, 2017.
(Continued)

*Primary Examiner* — Khanh V Nguyen
*Assistant Examiner* — Khiem D Nguyen
(74) *Attorney, Agent, or Firm* — Martin & Ferraro, LLP

(57) ABSTRACT

An amplifier for signal amplification, the amplifier comprising: a signal input arrangement; a signal output arrangement; a first transistor; a second transistor; and a third transistor, wherein: the first, second and third transistors are coupled to one another to form a transconductance cell, the transconductance cell is coupled to the signal input arrangement and the signal output arrangement, and the transconductance cell is operable to receive a first signal from the signal input arrangement, amplify the first signal and output an amplified first signal to the signal output arrangement. There is also disclosed a receiver incorporating the amplifier and methods of operating the amplifier.

15 Claims, 11 Drawing Sheets

(30) Foreign Application Priority Data

Nov. 2, 2015 (GB) .................................. 1519348.5
Nov. 2, 2015 (GB) .................................. 1519350.1

(51) Int. Cl.
*H03F 1/22* (2006.01)
*H03F 1/42* (2006.01)
*H03F 1/56* (2006.01)
*H03F 3/191* (2006.01)

(52) U.S. Cl.
CPC ....... *H03F 3/191* (2013.01); *H03F 2200/294* (2013.01); *H03F 2200/318* (2013.01); *H03F 2200/391* (2013.01); *H03F 2200/489* (2013.01); *H03F 2200/537* (2013.01); *H03F 2200/54* (2013.01); *H03F 2203/45631* (2013.01); *H03F 2203/45638* (2013.01); *H03F 2203/45702* (2013.01)

(58) Field of Classification Search
USPC .................................. 330/277, 301, 302, 311
See application file for complete search history.

(56) References Cited

OTHER PUBLICATIONS

Aravinth Kumar et al,, "Transformer Coupled Novel Noise Cancellation Technique for Subthreshold UWB LNA," Computers and Devices for Communication (CODEC), 2012 5th International Conference on, IEEE, Dec. 17, 2012, pp. 1-4.

Galal et al., "10-Gb/s Limiting Amplifier and Laser/Modulator Driver in 0,18-μm CMOS Technology," IEEE Journal of Solid-State Circuits, IEEE Service Center, vol. 38, No. 12, Dec. 1, 2003, pp. 2138-2146.

\* cited by examiner

LOW NOISE AMPLIFIER

This is a National Phase Application under 35 U.S.C. § 371 of PCT/GB2016/053372 filed Oct. 31, 2016 (published on May 4, 2017 as WO 2017/072533); which claims priority to Great Britain Application No. 1519263.6 filed Oct. 30, 2015; Great Britain Application No. 1519262.8 filed Oct. 30, 2015; Great Britain Application No. 1519350.1 filed Nov. 2, 2015; and Great Britain Application No. 1519348.5 filed Nov. 2, 2015; all of which are incorporated by reference herein in their entirety.

TECHNICAL FIELD

This invention relates to a low noise amplifier, particularly for use in mm-wave applications, a method of operating the amplifier and a receiver incorporating the amplifier.

BACKGROUND ART

Recent Federal Communications Commission (FCC) regulations has freed up some unlicensed millimeter-wave (mm-wave) frequencies [1]-[2]. Such regulations stem from lower overcrowded spectrums and the increasing demand of users for high data rate wireless communications and radar sensors. Receivers targeting microwave and mm-wave applications based on the wireless metropolitan area network standards ranging from 10-66 GHz, ultra-wideband radar vehicular sensor from 22-29 GHz, and military radar for unmanned aerial vehicle (UAV) from 35-37 GHz [3], etc. are essential to achieve the user end demands. This frequency spectrum allocation still encounters adjacent channel coexistence, similar to lower frequency spectrums, like radio astronomy at 23.6-24 GHz, industrial-scientific-medical (ISM) at 24.05-24.25 GHz, local multipoint-distribution system (LMDS) at 31 GHz, and cloud radar at 35 GHz [4]. In fact, it presents a dilemma for some sensitive frequency bands where overlapping exists. The design of silicon-based radio frequency integrated circuit (RFIC) receiver front ends at these frequencies for wideband performance with simultaneously high gain and high linearity is very challenging.

Low-noise amplifier (LNA) plays a crucial role in achieving high gain and linearity over wide operating frequency ranges for these receivers. Active balun-LNAs are LNAs capable of providing differential outputs from a single-ended input and are important component in receivers. Various wideband active balun-LNAs on silicon at low frequencies, which implement active and passive feedback mechanisms to improve linearity, gain and phase errors mismatches, have been reported [5],[6]. However, employing active feedback comes at the expense of power and nonlinearity rendering the harmonics cancellation ineffective [6]. A linearization technique based on derivative superposition and its improved derivative version tend to provide impressive input referred third order intercept point ($IIP_3$) [18], [20]. The derivative superposition methods use auxiliary N/PMOS path in weak inversion to cancel the third-order nonlinear current of the main transconductance gain-stage path, thus enhancing $IIP_3$. Nonetheless, this improvement is subject to deter the second inter-modulation product ($IIP_2$) due to nonlinear cross terms between the two paths [18]. Further, current-mode balun-LNA based common-gate common-source structures with bias control and output conductance kept constant show optimum behavior for both noise and linearity [14], [19]. Such constrain across wideband is costly in terms of power consumption and subject to process, voltage, and temperature variations. Another approach is making third inter-modulation IM3 cancellation independent of frequency in bipolar junction transistor (BJT) [15]-[17]. A second-harmonic control with fully differential mode configuration using BJT devices facilitates frequency independent IM3 cancellation [15]. In [16]-[17], IM3 cancellation happens due to current hyperbolic tangent behavior from dual gated BJT devices in differential and pseudo-differential modes added to the output. However, the cost is doubled in noise and power consumption.

All of these techniques were implemented in designs operating below 2.4 GHz. A 20 GHz balun-LNA using 0.25 µm SiGe BiCMOS technology was reported in [7]. This balun-LNA [7] consists of a common-emitter gain stage followed by a single-to-differential output buffer stage using a common-emitter common-base (CE-CB) structure with ac current source. This design suffers from very high phase and gain mismatches, thus limiting the bandwidth. These works show a tradeoff between linearity, power consumption, and gain.

SUMMARY OF INVENTION

Aspects of the invention are recited in the accompanying claims.

One aspect of the invention provides an amplifier for signal amplification, the amplifier comprising: a signal input arrangement; a signal output arrangement; a first transistor; a second transistor; and a third transistor, wherein: the first, second and third transistors are coupled to one another to form a transconductance cell, the transconductance cell is coupled to the signal input arrangement and the signal output arrangement, and the transconductance cell is operable to receive a first signal from the signal input arrangement, amplify the first signal and output an amplified first signal to the signal output arrangement.

Preferably, the transconductance cell is configured with the collector terminal of the first transistor coupled to the base terminal of the second transistor and the emitter terminal of the third transistor.

Conveniently, the amplifier further comprises: a first inductor coupled to the emitter of the first transistor; a second inductor coupled between the collector of the first transistor and the base of the second transistor, wherein the first inductor and the second inductor are arranged to operate respectively as a first coil of a transformer and a second coil of a transformer.

Advantageously, the transformer is configured to perform at least one of increasing the voltage gain of the amplifier and/or increasing the signal bandwidth of the amplifier.

Preferably, the signal input arrangement comprises an impedance matching circuit which is coupled to the first transistor, the impedance matching circuit comprising the first inductor and a third inductor each coupled to the base of the first transistor.

Conveniently, the amplifier further comprises a fourth inductor coupled between the emitter of the third transistor and the collector of the first transistor.

Advantageously, the collector of the second transistor is coupled to the emitter of a fourth transistor, and wherein the first, second, third and fourth transistors are arranged in a common-emitter configuration.

Preferably, the base of the third transistor, the base of the fourth transistor and a power supply input are coupled to one another.

Conveniently, the signal output arrangement comprises: a first output portion coupled to the collector of the third transistor; and a second output portion coupled to collector of the fourth transistor.

Advantageously, the first output portion includes a first pair of series connected inductors and a first output terminal coupled to the connection between the first pair of inductors, and wherein the second output portion includes a second pair of series connected inductors and a second output terminal coupled to the connection between the second pair of inductors. Preferably, the amplifier further comprises: a first resistor coupled between the first output portion and the power supply input; and a second resistor coupled between the second output portion and the power supply input.

Conveniently, the inductance of the first pair of inductors is equal to the inductance of the second pair of inductors.

Advantageously, the amplifier is configured to be operable with a passive mixer and a trans-impedance amplifier and the signal output arrangement is coupled to a class AB amplifier.

Preferably, the first signal comprises at least one signal having a frequency of 22 GHz to 35 GHz.

Conveniently, the amplifier is constructed using a SiGe BiCMOS process.

The present invention provides an improved low noise amplifier with wideband characteristics, high linearity and low power consumption.

Embodiments of the invention incorporate some or all of the following features either individually or in any combination: a low-power-consumption wideband 0.18 μm BiCMOS active balun-LNA with linearity improvement technique for millimeter-wave applications is proposed. The linearity technique utilizes constant Gm transconductance structure with second-order intermodulation ($IM_2$) cancellation that provides robustness to input and output variations. The constant Gm is established with equal emitters' area ratios and proper base-emitter biasing voltage; thus improving linearity. Furthermore, power saving is achieved using inductive coupling boosting the overall Gm structure and reducing the current consumption for the auxiliary gain stage. The measured balun-LNA's power gain between the input and two outputs are 15.4 dB and 15.6 dB with input return loss greater than 8.7 dB. The gain and phase mismatches are less than 1.8 dB and 12°, respectively. The balun-LNA noise figures between the input and two outputs are less than 5.8 dB and 7.09 dB at 35 GHz. The measured P1 dB's and IIP3's are more than −14.8 and −6 dBm across 22-35 GHz, respectively, and the total power consumption is less than 9 mW drawn from 1.8V power supply.

One embodiment of the low noise amplifier is a 0.18 μm SiGe BiCMOS 22-35 GHz active balun-LNA with high linearity and low power consumption.

The linearity improvement is attained using a new linearity technique based on a constant Gm-cell transconductance that forms the balun-LNA structure of the embodiment.

The constant Gm-cell transconductance is established through equal emitters' area ratios of the balun-LNA embodiment. The constant small-signal Gm-cell transconductance remains independent of input and output variations under large-signal behavior and provides second-order intermodulation ($IM_2$) cancellation, resulting in improved linearity.

The low power consumption is due in part to the coupled inductors used between cascaded stages. The balun-LNA embodiment targets multi-standard multi-channel receivers' applications ranging from 22-35 GHz that require high linearity. Many microwave and mm-wave applications not only coexist, but also overlap each other on the same frequency spectrum, making the linearity the bottle neck for the receiver's dynamic range.

BRIEF DESCRIPTION OF DRAWINGS

In order that the present invention may be more readily understood, reference is made by way of example to the following drawings, in which.

DETAILED DESCRIPTION

Figure 1:
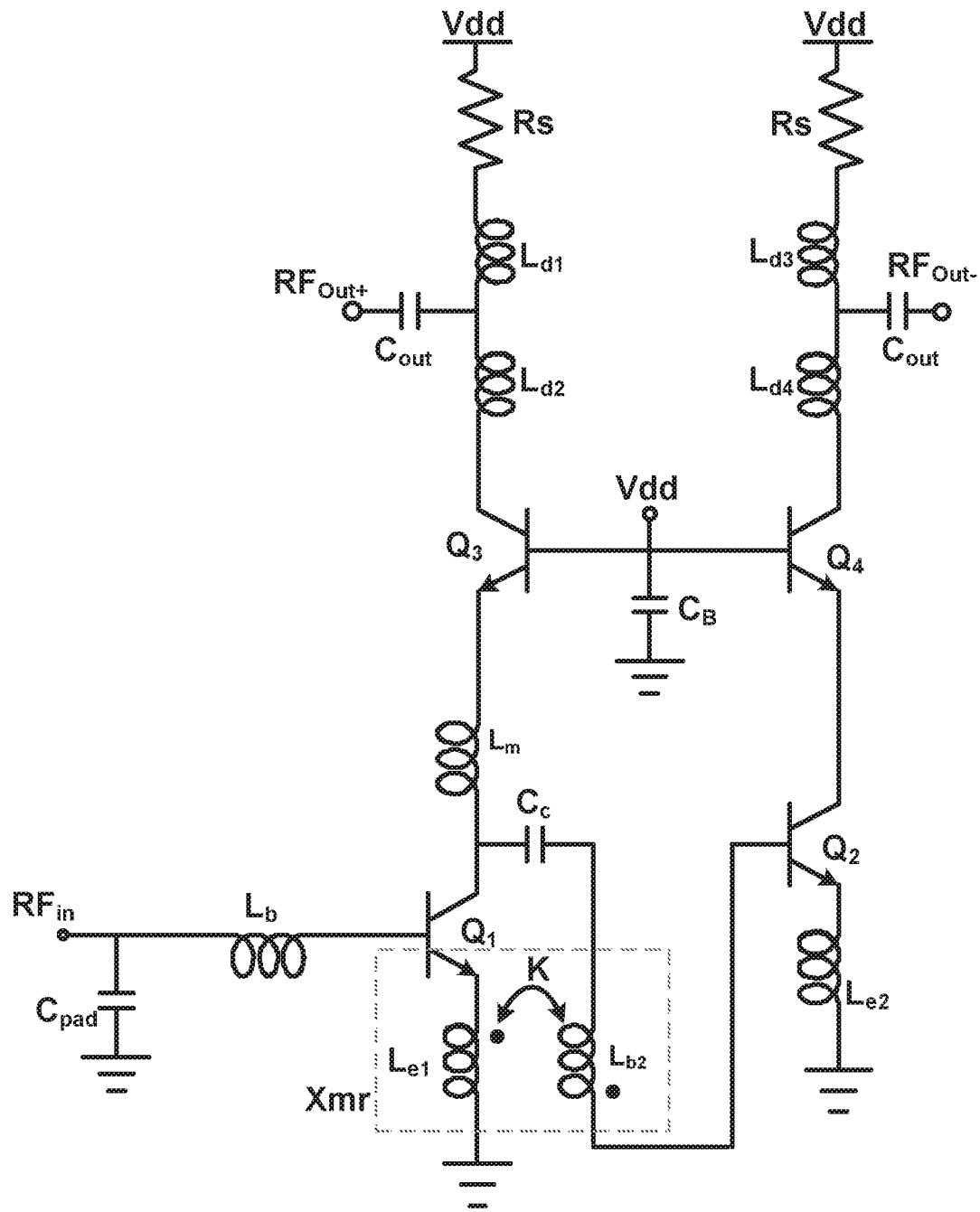
FIG. 1. shows a schematic of a low noise amplifier in a balun-LNA.

FIG. 1 shows a schematic of an embodiment of a 22-35 GHz (single-to-differential) wideband active balun and Low Noise Amplifier (LNA) with high gain, high linearity, and low power consumption.

Embodiments of the invention are described in detail below in relation to specific figures. The features disclosed in this description in relation to a specific embodiment or in relation to a specific figure are not restricted to adoption in only that embodiment or in only that figure. Such features described in relation to a particular embodiment or in relation to a specific figure may also be adopted in other embodiments or in connection with other figures unless there is a specific technical conflict between the embodiments or figures. Accordingly, the features recited in the description are embodied in the invention, as appropriate, either separately in relation to a particular embodiment or in relation to a specific figure, or in any combination of such features.

The balun-LNA embodiment architecture of FIG. 1 consists of a main transconductance gm gain stage, $Q_1$, coupled to an auxiliary gain path, $Q_2$, through a transformer. The coupled transformer increases the signal swing at the input of the second stage, thus boosting the Gm transconductance, hence gain, and reducing the power consumption. The composite Gm cell defined by transistors $Q_1$, $Q_2$, and $Q_3$ plays a major role in improving the linearization of the structure. The stipulated total Gm stays constant even in the presence of variations in $gm_1$ of $Q_1$ and $gm_2$ of $Q_2$ due to high input power. As the collector currents of transistors $Q_1$ and $Q_2$ vary from their quiescent bias under large voltage swing; the gm's dependency on equal emitters' area ($A_e$) ratios keeps the overall Gm-cell constant. The overall Gm's constant and frequency-independent characteristic behavior with IM2 cancellation results in linearity enhancement.

A simple wideband input matching network is established using inductors $L_b$ and $L_{e1}$ similar to [10]. Preferably, the signal input arrangement comprises an impedance matching circuit Xmr which is coupled to first transistor $Q_1$, the impedance matching circuit Xmr comprising a first inductor $L_{e1}$ and a third inductor $L_{b2}$ each coupled to the base of first transistor $Q_1$. First inductor $L_{e1}$ is directly coupled and third inductor $L_{b2}$ is inductively coupled to the base of first transistor $Q_1$. The effect of the coupling transformer ($L_{e1}$, $L_{b2}$) on the input matching is considered thoroughly in the later in the description. Inductive shunt peaking is used at the output loads (output portions) to extend the matching bandwidth of the balun-LNA.

The noise due to the cascode transistor $Q_3$ is reduced by adding an inductor $L_m$ to resonate away the parasitic capacitance at the emitter, thus reducing the output noise.

Input Matching Network

Figure 2:
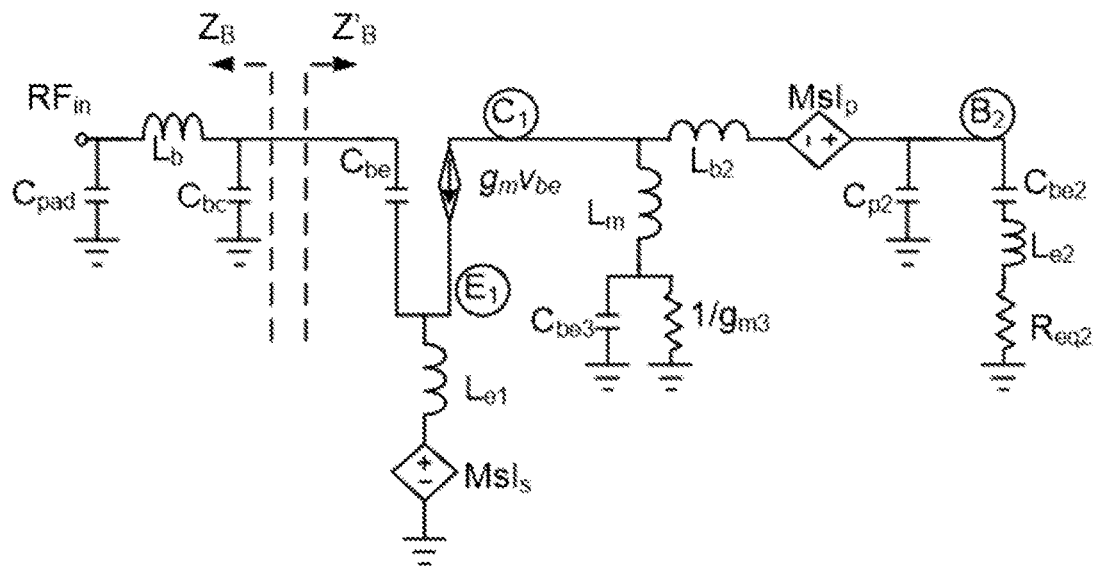
FIG. 2. shows the small signal model of the balun-LNA's input impedance.

FIG. 2 shows the small-signal input impedance of the balun-LNA derived from its schematic in FIG. 1. $g_m$ is the small signal transconductance of $Q_1$. $R_{eq2}$ is defined as $\omega_T L_{e2}$ of $Q_2$, $I_p$ and $I_s$ are the primary and secondary currents of the transformer.

To keep the analysis simple; the input impedance of the balun-LNA is split into two sections $Z_B$ and $Z'_B$, which represent the input impedances looking into the respective networks. Under the perfect matching condition, $Z_B = Z'^*_B$. $Z_B$ forms a pi-network with wideband matching characteristics, whose quality factor (Q) reduces due to the loading of the network represented by $Z'_B$. For the ac coupled transformer ($L_{e1}$ and $L_{b2}$) in $Z'_B$, the coupling coefficient K and the number of turn n can cause the optimum matching point to shift; yet keeping wideband impedance matched to the input port. To study this effect, an expression for the complex conjugate impedance $Z'^*B$ is derived. $Z'^*B$ is found using the small-signal model in FIG. 2 whereas the adapted transformer model is similar to that in [13]. Applying Kirchhoff current law (KCL) at nodes $E_1$, $C_1$ and $B_2$, where M is the mutual inductance;

$$K = \frac{M}{\sqrt{L_P L_S}}$$

is the coupling coefficient, and $n = \sqrt{L_P L_S}$ is the turn ratio of the ac coupled transformer, can lead to $Z'^*_B$. $C_{pad}$ is defined as the parasitic capacitance due to RF pad on chip. $C_{be}$, $C_{be2}$, and $C_{be3}$ are the parasitic capacitances at the base-emitter junctions of transistors $Q_1$, $Q_2$, and $Q_3$, respectively. Additionally, $C_{he}$, and $C_{p2}$ are the capacitances at the base-collector junction of transistors $Q_1$ and $Q_2$. The KCL equations yield, after several manipulations:

$$V'_B(s) = i'_B(s)\left(1 + \frac{1}{sC_{be}}(1 + sg_m L_{e1})\right) - MsI_s \quad (1)$$

where $V'_B(s)$ is the base voltage looking into $Z'_B$ network port, and $i'_B(s)$ is its current defined as $i'_B(s) = sC_{be}V_{be}$.

The secondary current $I_s$ of (I) can be derived as $$I_s = i'_B(s)\left[\frac{g_m Z_1 - sM(sC_{be} + g_m)}{sC_{be}(Z_1 - sL_{b2} - Z_2)}\right] \quad (3)$$

where $$Z_1 = sL_m + \frac{1}{g_{m3} + sC_{be3}} \quad (4)$$

$$Z_2 = \frac{\left(\frac{1}{sC_{be2}} + sL_{e2} + R_{eq2}\right)}{1 + 1/sC_{p2}\left(\frac{1}{sC_{be2}} + sL_{e2} + R_{eq2}\right)} \quad (5)$$

Substituting $I_s$ into $V'_B(s)$ and taking the ratio between (1) and (2) gives $$Z'_B(s) = \qquad (6)$$
$$1 + \frac{1}{sC_{be}}\left[1 + sL_{e1}\left(g_m - \frac{s(Kn)g_m Z_1}{Z_1 - sL_{b2} - Z_2} + \frac{s^2(Kn)^2 sL_{e1}(g_m + sC_{be})}{Z_1 - sL_{b2} - Z_2}\right)\right]$$

$Z'_B(s)$ shows that any changes in the coupling coefficient K or the number of turn ratio n for the coupled transformer can affect the poles and zeros alike; thus causing the matching to shift into higher frequency; yet maintaining the wideband characteristics due to poles-zeros cancellation effect.

Figure 3:
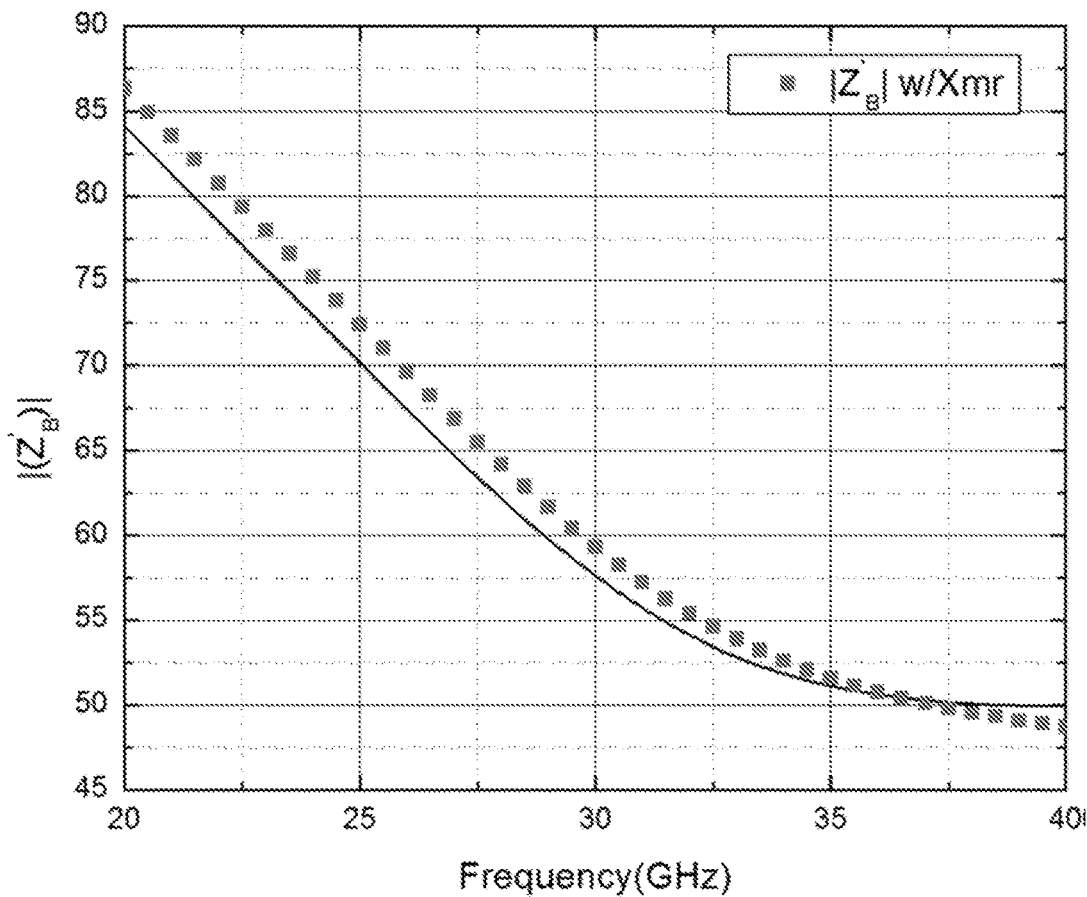
FIG. 3. shows a comparison of magnitudes of $Z'_B$ with and without transformer.

FIG. 3 shows the schematic level simulation for the magnitude of $Z'_B(s)$ with and without the transformer, It is clear that the wideband matching characteristic is maintained with only small variation less than 2Ω in the worst case.

Low Noise Amplifier Linearity

Figure 4:
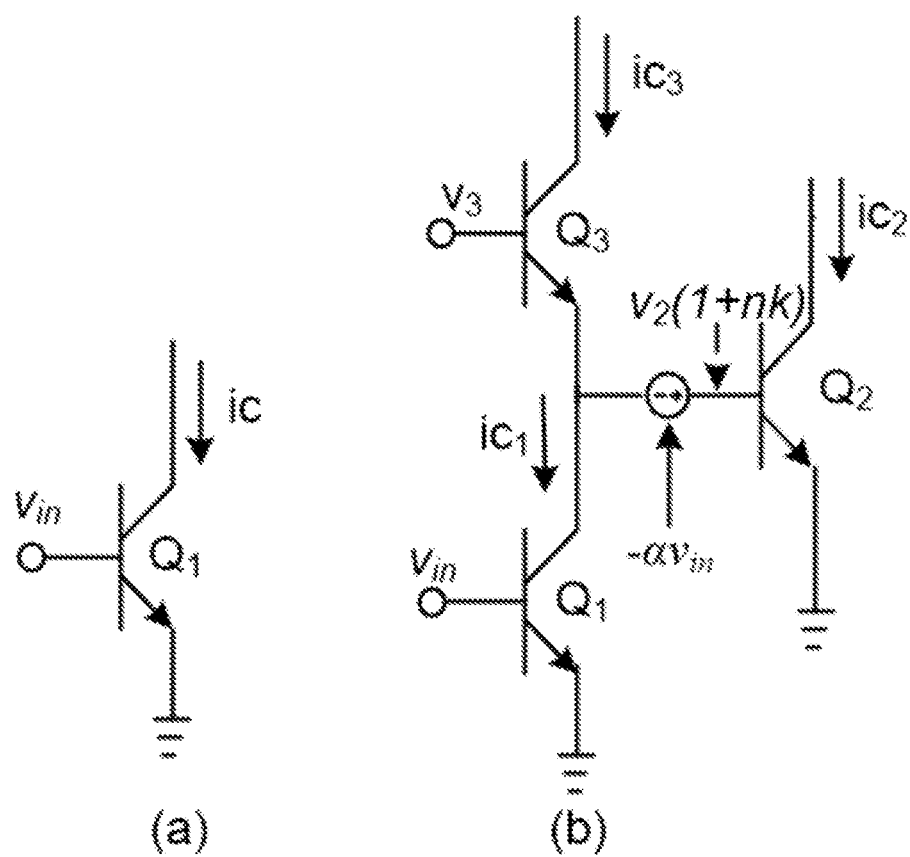
FIG. 4. shows the linearity model analysis for the conventional common-emitter gm stage as well the balun-LNA embodiment Gm structure including the effect of the transformer.

FIG. 4(a) shows the linearity model analysis for the conventional common-emitter gm stage. Using Taylor series expansion approximation, the output collector current for the CE stage is given by $$i_C \cong gm\left[\sum_{q=1,2,...}^{\infty} \frac{V_T}{q!}\left(\frac{v_{in}}{V_T}\right)^q\right] \quad (7)$$

where $gm = I_{Q1}/V_T$, with $I_{Q1}$ being the quiescent current of $Q_1$ and $V_T$ being the thermal voltage, is the voltage to current conversion also known as the small signal transconductance gm; and $v_{in}$ is the input voltage. From (7), taking the $q^{th}$ order derivatives of gm with respect to $v_{in}$ encompasses all nonlinearities for the CE stage. Assuming $v_{in} = V_\alpha \cos(\omega t)$ and taking the ratio between the second and the fundamental harmonic amplitude in a CE stage gives the second-order harmonic distortion as $$HD_2 = \frac{1}{4}\left[\frac{V_a}{V_T}\right] \quad (8)$$

The collector currents in the proposed Gm stage for the balun-LNA as shown in FIG. 4(b) can be derived using (7) as $$i_{C1} \cong I_{Q1}\left(\frac{v_{in}}{V_T} + \frac{1}{2!}\left(\frac{v_{in}}{V_T}\right)^2 + \frac{1}{3!}\left(\frac{v_{in}}{V_T}\right)^3 + \ldots\right)$$

$$i_{C2} \cong I_{Q2}\left(\frac{v_2(1+nK)}{V_T} + \frac{1}{2!}\left(\frac{v_2(1+nK)}{V_T}\right)^2 + \frac{1}{3!}\left(\frac{v_2(1+nK)}{V_T}\right)^3 + \ldots\right)$$

$$i_{C3} \cong I_{Q3}\left(\frac{-v_2}{V_T} + \frac{1}{2!}\left(\frac{-v_2}{V_T}\right)^2 + \frac{1}{3!}\left(\frac{-v_2}{V_T}\right)^3 + \ldots\right)$$

$$(9)$$

Using (9), we find the differential output current $i_{Out} = i_{C3} - i_{C2}$ with respect to the input voltage $v_{in}$ assuming $i_{C1} = i_{C3}$ and using the fact that $-v_2/v_{in} = -g_{m1}/g_{m3} = -A_{e1}/A_{e3}$, where $A_{e1}$ and $A_{e3}$ represent the emitter area for $Q_1$ and $Q_3$; respectively, as $$i_{Out} = \begin{bmatrix} I_{Q3}\left(\frac{-(A_{e1}/A_{e3})v_{in}}{V_T}\right)\left(1 + \frac{I_{Q2}(1+nK)}{I_{Q3}}\right) + \\ \frac{I_{Q3}}{2}\left(\frac{(A_{e1}/A_{e3})v_{in}}{V_T}\right)^2\left(1 - \frac{I_{Q2}(1+nK)^2}{I_{Q3}}\right) + \\ \frac{I_{Q3}}{6}\left(\frac{-(A_{e1}/A_{e3})v_{in}}{V_T}\right)^3\left(1 + \frac{I_{Q2}(1+nK)^3}{I_{Q3}}\right) + \ldots \end{bmatrix} \quad (10)$$

Substituting $v_{in} = V_\alpha \cos(\omega t)$ into (10) results in $$i_{Out} = \left[\left[\left(I_{Q3}\left(\frac{-(A_{e1}/A_{e3})V_a}{V_T}\right)\right)\right]\right] \quad (11)$$

$$\left(\left(1 + \frac{I_{Q2}(1+nK)}{I_{Q3}}\right) - \frac{1}{8}\left(\frac{(A_{e1}/A_{e3})V_a}{V_T}\right)^2\left(1 + \frac{I_{Q2}(1+nK)^3}{I_{Q3}}\right)\right)$$

$$\cos\omega t + \frac{I_{Q3}}{4}\left(\frac{(A_{e1}/A_{e3})V_a}{V_T}\right)^2(1 + \cos 2\omega t)\left(1 - \frac{I_{Q2}(1+nK)^2}{I_{Q3}}\right) +$$

-continued $$\frac{I_{Q3}}{24}\left(\frac{-(A_{e1}/A_{e3})V_a}{V_T}\right)^3(\cos 3\omega t)\left(1 + \frac{I_{Q2}(1+nK)^3}{I_{Q3}}\right) + \ldots\right]$$

From (11), considering the ratios between the second, and the fundamental amplitude harmonics as well between the third and the fundamental amplitude harmonics for the proposed Gm stage gives $HD_{2,Gm}$ and $HD_{1,Gm}$ respectively, as $$HD_{2,Gm} = \left|\frac{\left(\frac{1}{4}\right)\left(\left(\frac{(A_{e1}/A_{e3})V_a}{V_T}\right)\right)\left(1 - \frac{I_{Q2}(1+nK)^2}{I_{Q3}}\right)}{\left(\left(\frac{1}{8}\right)\left(\frac{(A_{e1}/A_{e3})V_a}{V_T}\right)^2\right)\left(1 + \frac{I_{Q2}(1+nK)^3}{I_{Q3}}\right) - \left(1 + \frac{I_{Q2}(1+nK)}{I_{Q3}}\right)}\right| \quad (12)$$

$$HD_{3,Gm} = \frac{\frac{1}{24}\left(\frac{(A_{e1}/A_{e3})V_a}{V_T}\right)^2\left(1 + \frac{I_{Q2}(1+nK)^3}{I_{Q3}}\right)}{\left(\left(1 + \frac{I_{Q2}(1+nK)}{I_{Q3}}\right) - \frac{1}{8}\left(\frac{(A_{e1}/A_{e3})V_a}{V_T}\right)^2\left(1 + \frac{I_{Q2}(1+nK)^3}{I_{Q3}}\right)\right)} \quad (13)$$

As can be seen from (12), the cancellation of the nonlinearity tor generated due to $HD_{2,Gm}$ is obtained under the condition $I_{Q2}(1+nK)^2 = I_{Q3}$ which means $$g_{m2} = \frac{g_{m3}}{(1+nK)^2}$$

and in turn, $V_{BE3} \approx V_{BE2}$ and $A_{e2} = A_{e3}$.

Hence, the overall Gm stays constant even in the presence of variations in $g_{m1}$ and $g_{m2}$ due to large input voltage signal. As the collector currents differ from their quiescent bias under large input power; the gm's dependency on the emitter area ratios keeps the overall Gm constant. This large signal constant gm characteristic results in linearity improvement. As $HD_{3,Gm}$ from (13) cannot be cancelled, equation (13) dictates the linearity limitation for this proposed architecture. However, there is a clear tradeoff between gain and linearity for this balun-LNA architecture. Keeping the aspect ratios $A_{e2} = A_{e3} = A_{e4}$ and $$g_{m2} = \frac{g_{m3}}{(1+nK)^2} = g_{m4}$$

between $Q_2$, $Q_3$ and $Q_4$ maximize the linearity at the expense of gain due to $$G_m = \left(g_{m1} + \left(\frac{g_{m1}}{g_{m3}} + nK\right)g_{m2}\right).$$

Figure 5:
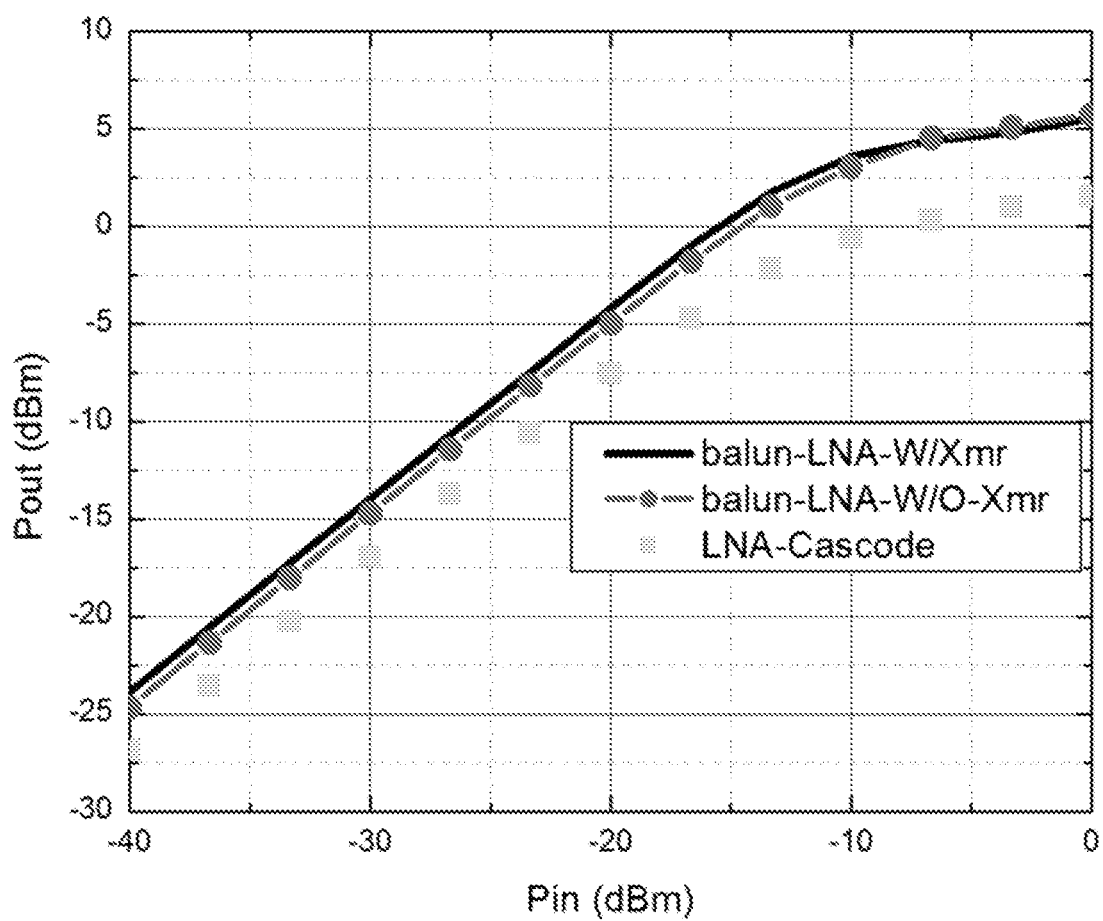
FIG. 5. shows comparison curves for (a) Cascode LNA, (b) balun-LNA with transformer, (c) balun-LNA without transformer.

Also, the $g_{m2}$ transconductance increases due to the transformer's product nK which help boost the gain for less dc current. However, given the transformer inductors' sizes and the limited nK value the linearity degradation is very small as depicted in FIG. 5.

The latter shows the simulation results of the input referred IdB gain compression for a cascode LNA and the proposed balun-LNA with and without transformer. All circuits consume 6.4 mA current from a 1.8V supply and achieve 16-dB power gain. The P1 dB for the regular cascade LNA and the proposed balun-LNA with and without transformer are −17.9 dBm, −13.37 dBm and −13.26 dBm, respectively. The linearity improvement of the balun-LNA with transformer as compared to the cascade LNA is better than 4.53 dB.

Noise Analysis

Figure 6:
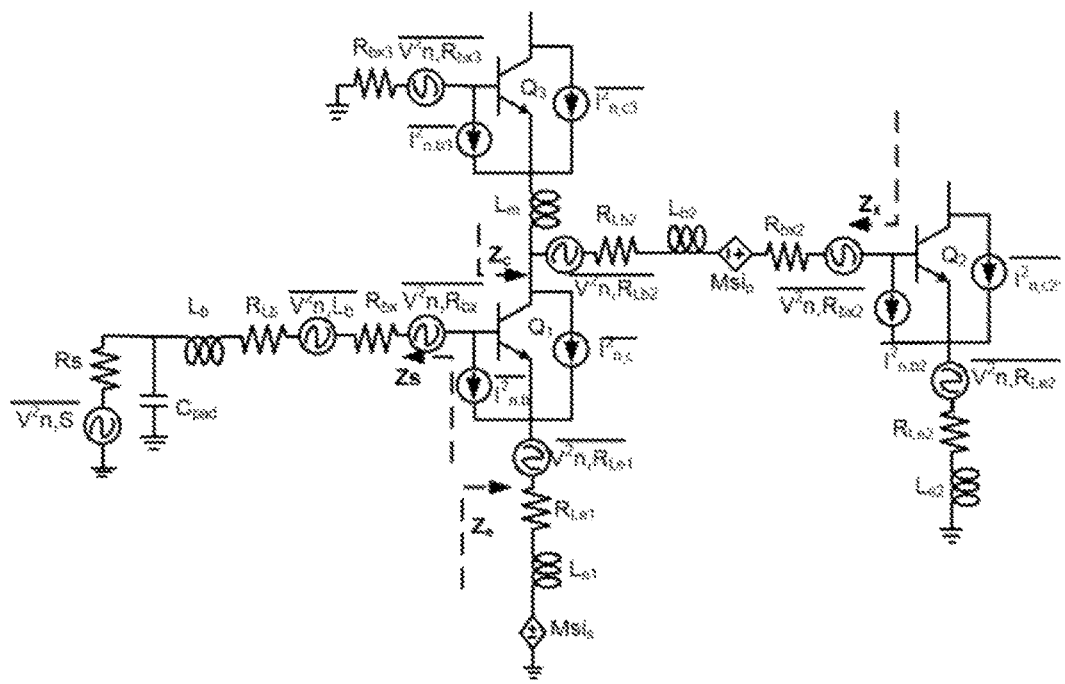
FIG. 6. shows the noise source model of the balun-LNA embodiment.

The noise of the proposed balun-LNA is dominated by the input stage including the matching network and its auxiliary path. FIG. 6 shows the circuit's main noise sources for the proposed balun-LNA. The noise sources include base and collector noise currents of $Q_1$ and $Q_2$. Noise due to the parasitic base resistances $R_{bx}$ and $R_{bx2}$ of $Q_1$ and $Q_2$, respectively, and noise due losses of $L_b$, $R_{Lb}$, and coupling transformer $L_{e1}$ and $L_{b2}$, $R_{Le1}$ and $R_{Lb2}$, is considered in the noise model. The noise due to the cascade transistor $Q_3$ is considerably reduced due to inductor $L_m$ rendering the degenerated impedance high at resonance, thus making its noise contribution negligible [10]. Furthermore; noise in the auxiliary path due to cascade transistor $Q_4$ is neglected due to multi-cascaded transconductance gain stages and, as a result, all cascade transistors are neglected in the following analysis.

The equivalent input-referred noise due to the base and collector current shot noise of $Q_1$, $Q_2$, and its base parasitic resistance $R_{bx2}$ are given by the equations (A8)-(A12) discussed later in the description. According to (A8) and (A9), the input referred noises of $Q_1$ increases proportionally with $L_b$ inductor's loss. This is because the signal to noise ratio (SNR) between the input and the emitter-base junction is inversely proportional to $L_b$. It is clear that there is a tradeoff between the input matching requirement for power transfer and the noise figure for this balun-LNA embodiment structure. However, equations (A8)-(A9) reflect the effect of the coupling transformer on the emitter impedance $Z_e$ of $Q_1$. A higher $Z_e$ helps improve the collector current noise at the expense of lower (SNR) at the emitter-base junction. Similarly, equations (A10-A12) show an increase in the SNR at the base-emitter junction of $Q_2$ raising the voltage gain through the coupling transformer by (nk) factor. The collector shot noise of $Q_2$ and its parasitic base resistance noise $R_{bx2}$ are improved by the same factor.

The total input referred voltage noise due to $Q_1$ and $Q_2$ $\sqrt{v^2_{ni,Q_{1,2}}}$, normalized to the noise voltage source impedance is given by $$\sqrt{\frac{v^2_{ni,Q_{1,2}}}{4kTR_S\Delta f}} \approx \frac{\Psi_1(\omega)}{g_{m1}} + (\Psi_2(\omega))g_{m1} + \quad (14)$$

-continued $$\frac{\Psi_3(\omega)}{\left[\frac{g_{m1}}{g_{m3}} + nK\right]} + (\Psi_4(\omega))\left[\frac{g_{m1}}{g_{m3}} + nK\right]g_{m2} + \frac{\Psi_5(\omega)}{\left[\frac{g_{m1}}{g_{m3}} + nK\right]g_{m2}}$$

$\psi_1(\omega)$-$\psi_5(\omega)$ are given by the equations (A13)-(A17). This result shows that the collector current shot noise of $Q_1$ and $Q_2$ can be improved by increasing $g_{m1}$, $g_{m2}$ and transformer's product nK, respectively. However, such improvement comes at the expense of degrading the base current shot noise. Hence, there is an optimum value for $g_{m1}$ and $g_{m2}$ to minimize the total input-referred noise voltage due to $Q_1$ and $Q_2$. Differentiating the first two terms and the last two terms of (14) with respect to $g_{m1}$ and $g_{m2}$ respectively and equating the resultant expressions to zero, results in $g_{m1,opt}$ and $g_{m2,opt}$, given by $$g_{m1,opt} = \sqrt{\frac{\Psi_1(\omega)}{\Psi_2(\omega)}} \quad (15)$$

$$g_{m2,opt} = \sqrt{\frac{\Psi_5(\omega)}{\Psi_4(\omega)}} \frac{1}{\left[\frac{g_{m1}}{g_{m3}} + nK\right]} \quad (16)$$

The third term in (14) is due to the parasitic base resistance noise, $R_{bx2}$ is limited by $g_{m1,opt}$, $A_{e2}$ emitter area of transistor $Q_2$, and the transformer coupling factor (nK). The total input referred noise figure of the proposed balun-LNA structure is given by $$NF_{tot}(\omega) \approx 1 + \frac{R_{L_b} + R_{bx}}{R_S}(1 + \omega^2 C_{pad}R_S) + \quad (17)$$

$$2\sqrt{\Psi_1(\omega)\Psi_2(\omega)} + \frac{\Psi_3(\omega)}{\left[\frac{1}{g_{m3}}\sqrt{\frac{\Psi_1(\omega)}{\Psi_2(\omega)}} + nk\right]} + 2\sqrt{\Psi_4(\omega)\Psi_5(\omega)}$$

Figure 7:
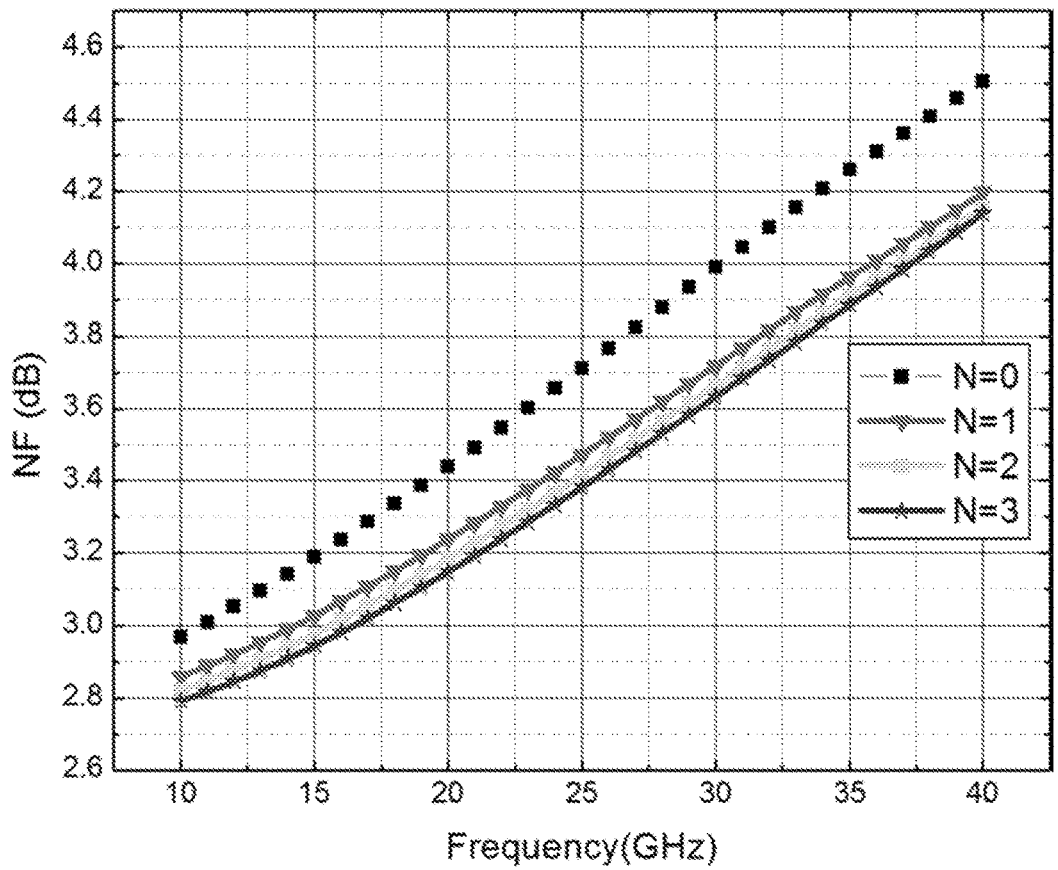
FIG. 7. shows NF values for the differential output of the balun-LNA embodiment with ideal coupling coefficient; K; and transformer multiple turns n.

FIG. 7 shows the noise figure simulations for the differential output of the balun-LNA. From (17); it is clear that signal to noise ratio (SNR) degradation between the source generator and the base-emitter junction capacitance is due to matching inductance loss $L_b$, $R_{Lb}$, the parasitic base resistance, $R_{bx}$, and pad capacitance, $C_{pad}$. Furthermore, an increase in the turn ratio of the coupling transformer could improve the noise figure.

However, the turn ratio cannot be increased randomly considering the coupling transformer non-idealities [21]. Losses associated with parasitic resistances and capacitances at the base of $Q_2$ measures quadratically compares to the secondary inductance of the transformer. Hence, the self-resonance frequency of the inductance suffers as well as the magnetic coupling, M, reflecting higher noise. Ultimately, there are practical limits for the voltage gain boosting effect and the optimal turn ratio n; thus achieving the lowest noise figure.

Stability and Power Efficiency

The effects of capacitors $C_{bc}$ and $C_{p2}$ on both channels are reduced due to the cascade structure. The added transistors, $Q_3$ and $Q_4$, transform the input impedances of the driving stages from negative impedances into a capacitive one; hence the stability is maintained. The transformer is designed in inverting configuration to provide gain boosting without compromising the balun-LNA stability.

The proposed balun-LNA structure having dual $g_m$, output from a single-ended input combines the LNA characteristic with the balun behavior into a single block. The inverting coupling transformer boosts $g_{m2}$ by (nK) factor. This topology has two properties:

1) it can further boosts the voltage gain at the base-emitter junction, thus reducing the dc bias point for a specific gain target which means less dc power consumption, and
2) by controlling the coupling coefficient polarity, K, through proper layout of the stacked transformer, the voltage gain can be increased (with positive K) or remains the same with bandwidth extended (for negative K).

Transformer and Inductor Layout

The presence of the parasitic capacitors and resistive losses generated from routing paths in integrated circuits causes lower quality factor in passive components, which could be significant at millimeter-wave frequencies. To accurately account for such effects, all inductors are simulated using electromagnetic (EM) simulator IE3D [22]. Inductors $L_{d1}$, $L_{d3}$, and $L_b$ are designed using spiral inductor due to their relatively large inductances. However; a careful consideration is being assigned for the metal width trading off the resistive loss, parasitic coupling to the substrate, quality factor and inductors self-resonance frequencies. To guarantee inductors behaviors at mm-wave frequencies; it is important to achieve the quality factor peak beyond the frequency of interest. To reduce all type of losses the top metal M6 is chosen for all inductors. Furthermore; inductors $L_m$, $L_{e2}$, $L_{d2}$, $L_{d4}$, and the coupling transformer $L_{e1}$, $L_{b2}$, are all implemented using microstrip transmission lines.

Figure 8:
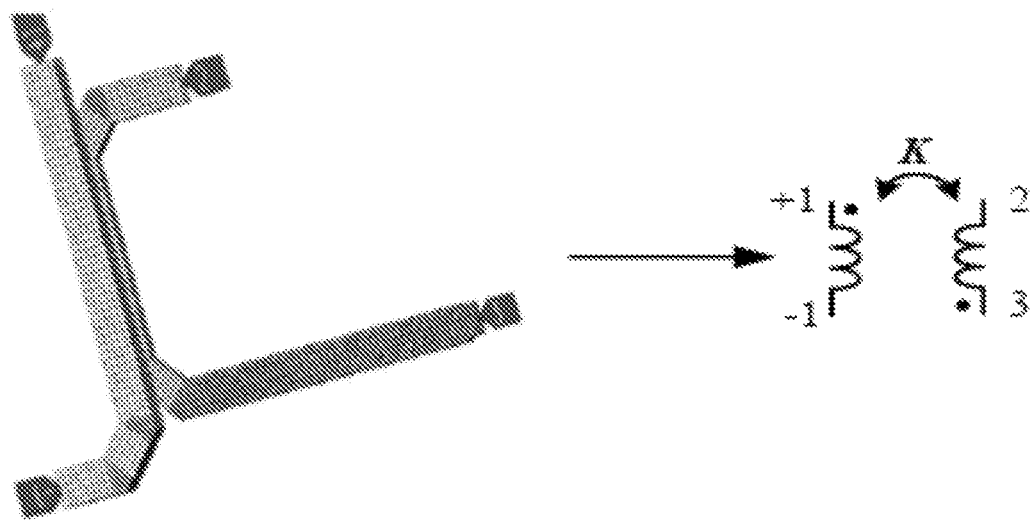
FIG. 8. shows a stacked transformer layout structure and its schematic.

The stacked coupling transformer is shown in FIG. 8 where $L_{e1}$ and $L_{b2}$ consist of primary and secondary inductors; respectively. The transformer inverting configuration is implemented to form a feed-forward path boosting the transconductance $g_{m2}$ input stage. All electromagnetic effects from eddy current substrate loss to frequency dependent metal loss are considered in the design process of the transformer.

In order to reduce the parasitic loss effect at high frequency; the stacked transformer is realized with the top metal layers M6 and M5 which are the thickest and farthest from the substrate, thus reducing losses. The quality factor and self-resonance frequency for both $L_{ei}$ and $L_{b2}$ remain almost identical. A high quality factor (Q) for the transformer inductances is needed to reduce its noise contribution into the balun-LNA structure.

For the optimal magnetic coupling between transformer conductors; the metal width for the microstrip transmission lines forming the transformer are set to the smallest possible (7.5 μm) constrained by the ohmic losses, the dc current, and the quality factor. The narrower the conductor dimensions width the higher the magnetic coupling between the transformer turns. However; increasing the metal width leads to higher parasitic capacitance losses to the substrate.

The coupling coefficient, K, for the stacked transformer is limited by the process technology due to metal thickness and minimum layers spacing as well as the optimal turn's ratio at mm-wave frequency. The benefits and limitations of increasing the turn ratios for the stacked transformer have been previously discussed. Thus, the stacked transformer is designed with 1:1 turn's ratio. $L_{e1}$ and $L_{b2}$ inductances are 82 pH and 120 pH, respectively. A coupling coefficient; K equal to 0.34 is achieved in the band of interest.

Figure 9:
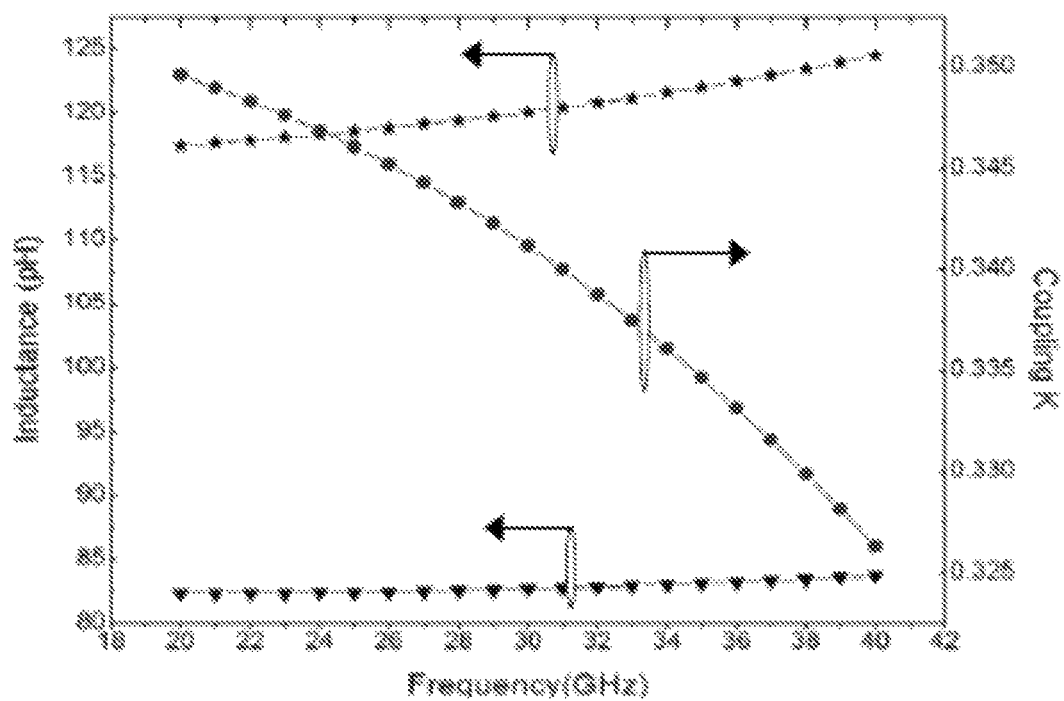
FIG. 9. shows inductance values; $L_{e1}$, $L_{b2}$, and coupling coefficient K, for stacked transformer using IE3D.

FIG. 9 shows the EM simulations results of the transformer inductances and the coupling coefficient. These parameters remain almost constant in the frequency range of interest. This is because the self-resonance frequency of the transformer is at higher frequency.

Simulation and Experimental Results

The wideband Balun-LNA embodiment was fabricated using 0.18 μm BiCMOS technology from Tower Jazz Semiconductor [23].

Figure 10:
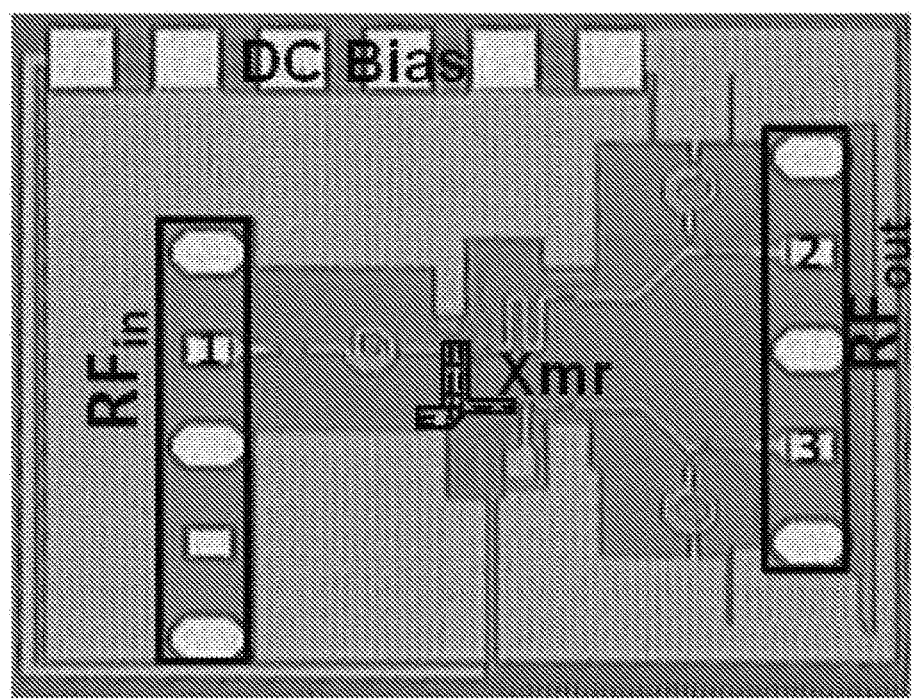
FIG. 10. shows a die photograph of the balun-LNA embodiment.

FIG. 10 shows the die micrograph of the balun-LNA embodiment, where the total area is 0.46 mm² excluding the RF and DC pads. On-wafer measurements were done using RF differential probes (G-S-G-S-G) for input and outputs. The use of RF differential input probe is necessary for calibration purposes using Cascade Microtech Impedance Standard Substrate (ISS) [24]. Although an RF differential probe is used at the input, the input signal is fed into only one port. Also, a 6-pin DC probe is used to provide the DC biasing. The balun-LNA core consumes 5 mA from 1.8V supply.

Figure 11:
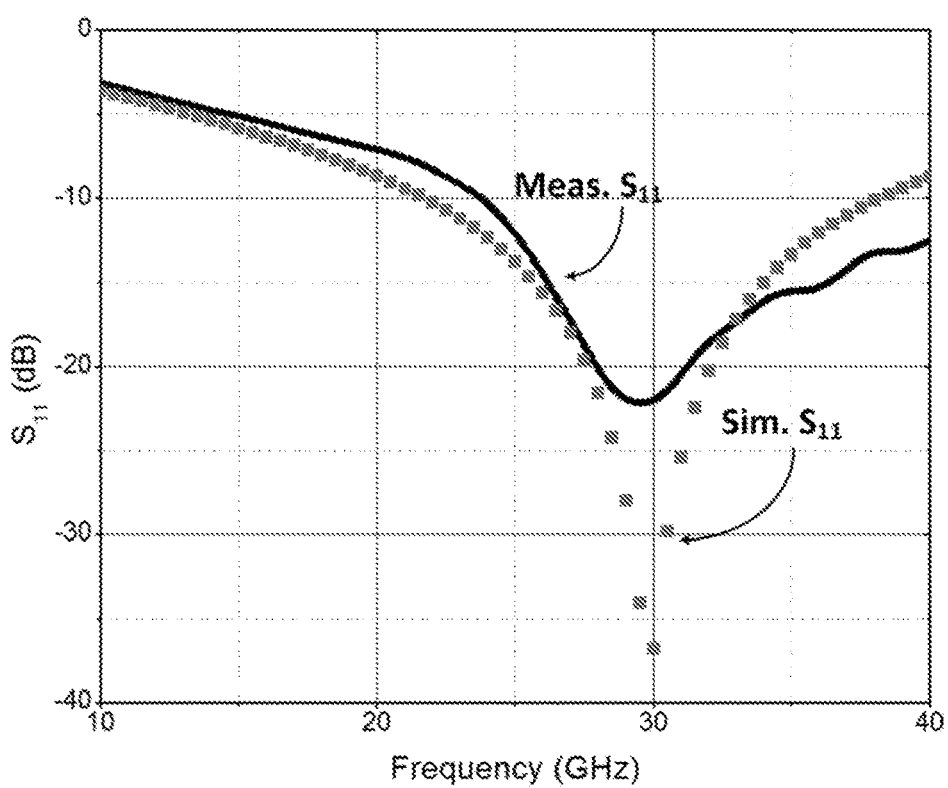
FIG. 11 shows the measured and simulated input return losses ($S_{11}$) for the balun-LNA.

FIG. 11 shows the measured and simulated input return losses ($S_{11}$) for the balun-LNA. Measured $S_1$, is larger than 8.7 dB for the entire operating frequency range of 22-35 GHz and up to 40 GHz.

Figure 12:
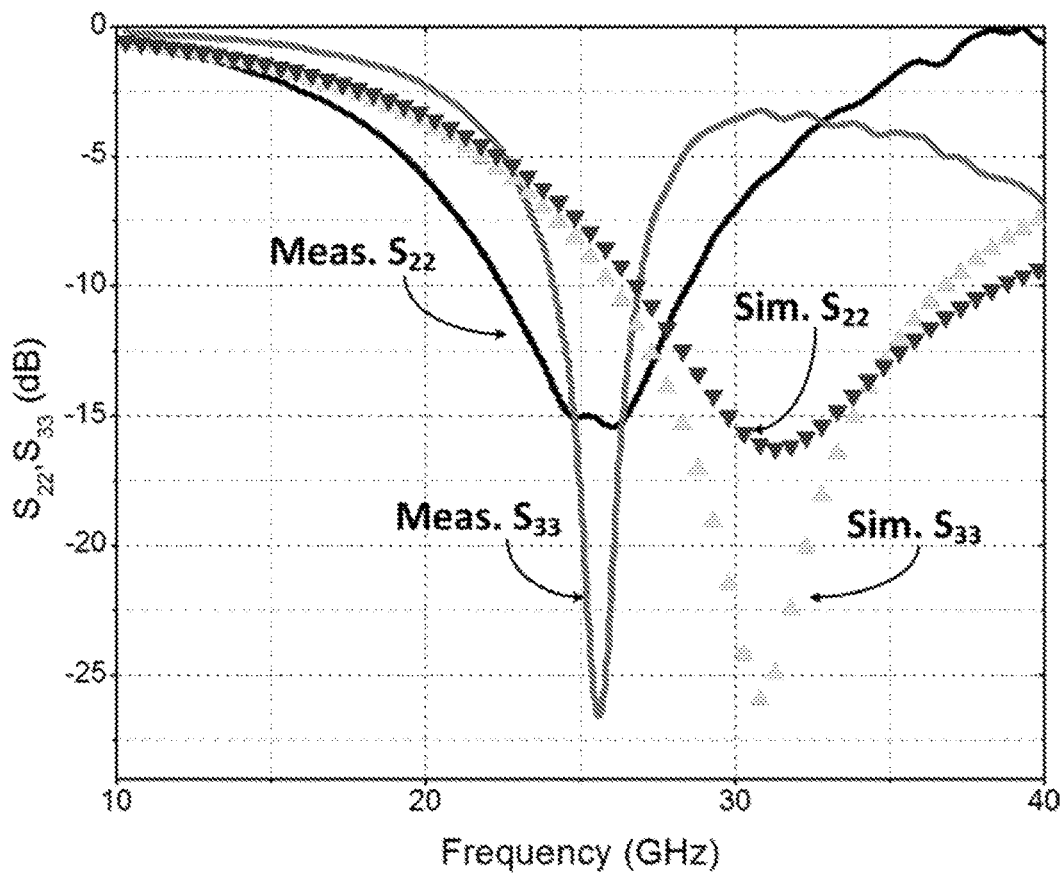
FIG. 12 shows the measured and simulated output return losses $S_{22}$ and $S_{33}$.
Figure 13:
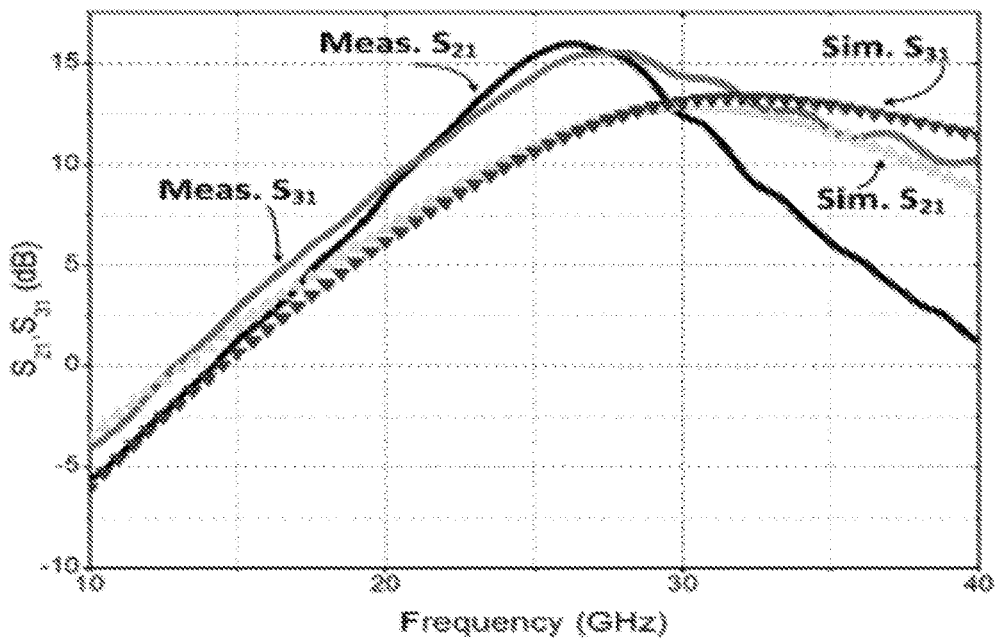
FIG. 13 shows $S_{21}$ and $S_{31}$ with a gain of 15.6 dB and 15.4 dB.

FIG. 12 displays the measured and simulated output return losses $S_{22}$ and $S_{33}$. Measured S22 is better than 9 dB from 22-29 GHz and $S_{33}$ is larger than 7.5 dB from 23.5-27.4 GHz. The shifting of the return loss responses at the outputs of the balun-LNA is mainly due to the variations of the small metal insulator metal (MIM) output capacitances as well as the parasitic inductances coupling to the substrate. Consequently, the measured power gains for the balun-LNA ($S_{21}$ and $S_{31}$) shift to 26.8 GHz and 27 GHz, respectively, as seen in FIG. 13, which shows $S_{21}$ and $S_{31}$ achieving a gain of 15.6 and 15.4 dB, respectively. This represents a measured differential gain boost of 2.0 dB and 2.4 dB for $S_{31}$ and $S_{21}$ compared to simulations. The measured 3-dB bandwidths for $S_{21}$ and $S_{31}$ are 7.6 GHz and 11.5 GHz, respectively. A 3.9 GHz bandwidth difference between $S_{21}$ and $S_{31}$ is mainly due to asymmetric signal path from input to outputs and unequal parasitic capacitances to the substrate.

Figure 14:
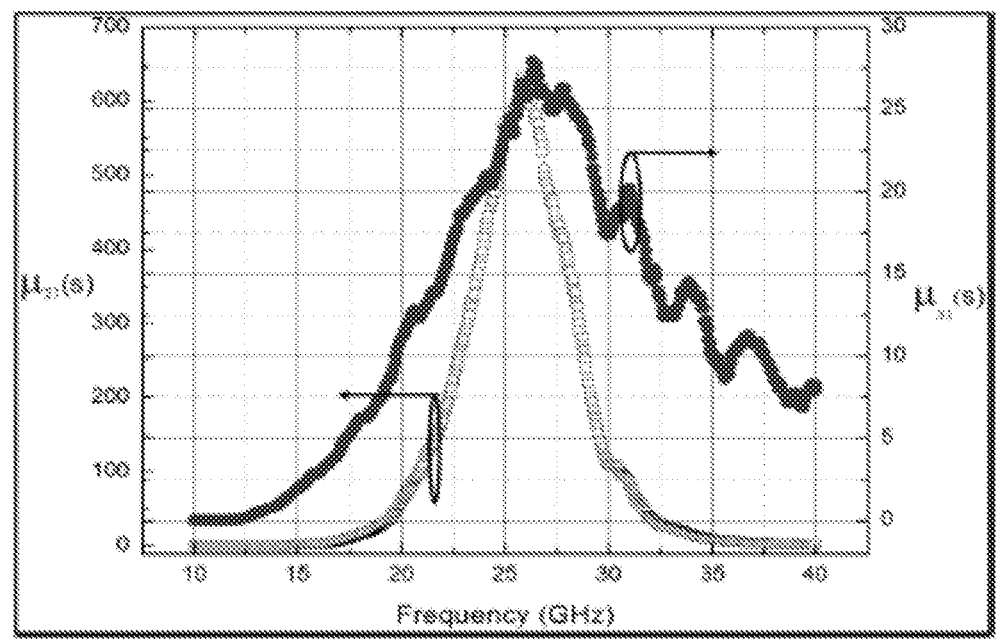
FIG. 14 shows the measured stability of the balun-LNA embodiment in terms of the stability parameter μ, derived from the measured S-parameters.
Figure 15:
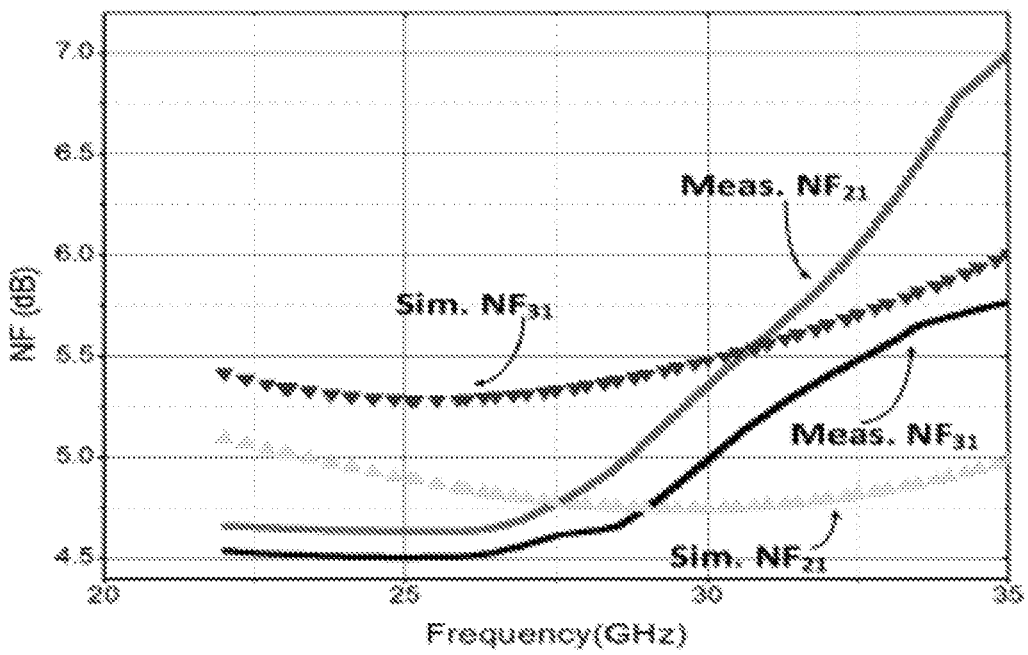
FIG. 15 shows the measured noise figures for both channels.

FIG. 14 shows the measured stability of the balun-LNA embodiment in term of the stability parameter μ [25], which is derived from the measured S-parameters. The balun-LNA is unconditionally stable for both channels across the 22-35 GHz bandwidth according to μ(s)>1. The measured noise figures for both channels are shown in FIG. 15, where the noise figures between input port 1 and output port 3 ($NF_{31}$) and input port 1 and output port 2 ($NF_{21}$) vary from 4.5 dB to 5.8 dB and from 4.6 dB to 7.09 dB, respectively. $NF_{21}$ experiences higher noise figure particularly due to channel gain drop. In the case of a differential to single ended balun applied at the output of the proposed balun-LNA, a 3-dB differential gain increase is possible and a much lower noise figure can be achieved due to common mode noise cancellation.

Figure 16:
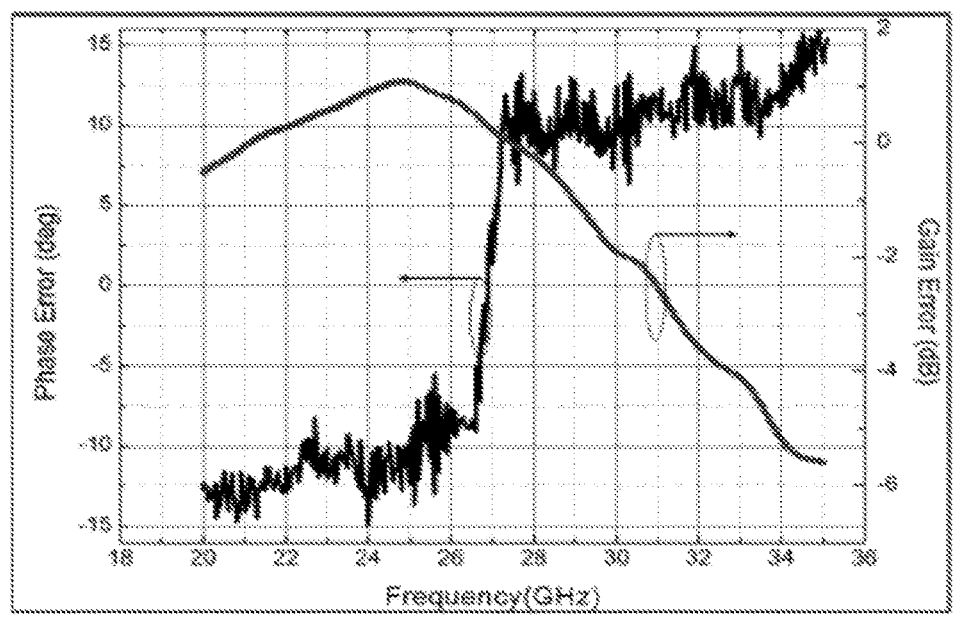
FIG. 16 shows the measured gain and phase imbalances.
Figure 17:
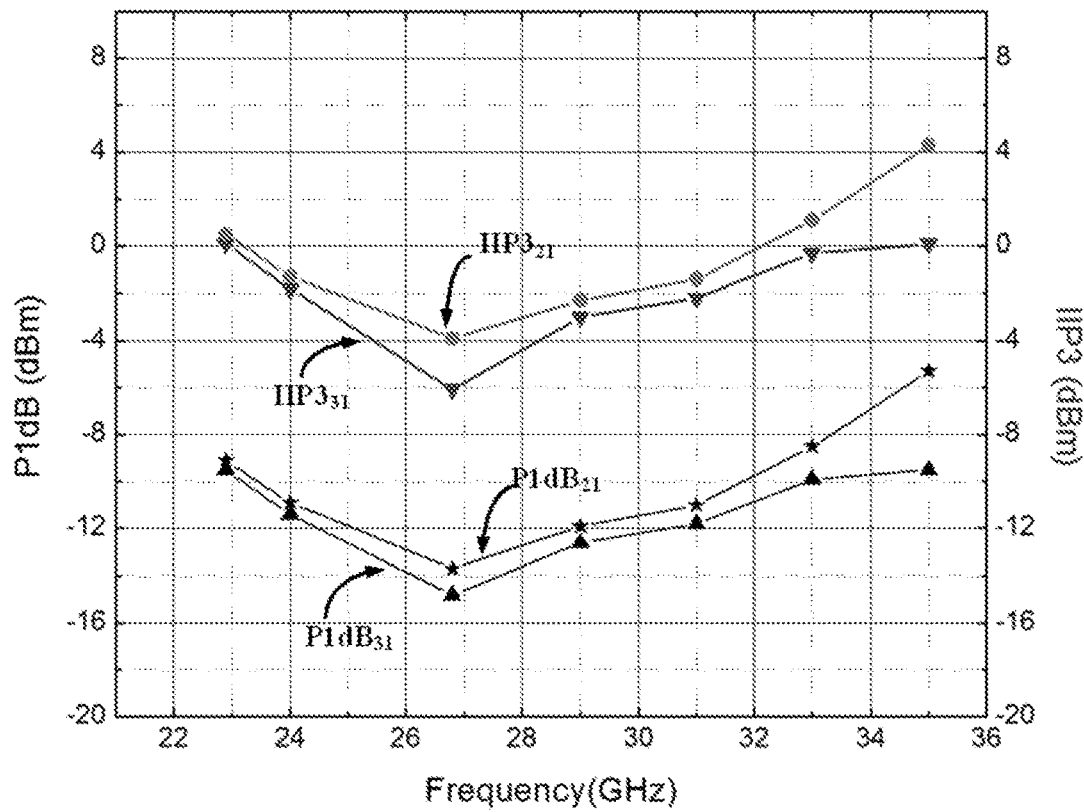
FIG. 17 shows the measurements of the 1-dB power compression points (P1 $dB_{21}$ P1 $dB_{31}$) and the input referred third order intercept points ($IIP3_{21}$ and $IIP3_{31}$) for both channels for the frequency range of 22-35 GHz.

The measured gain and phase imbalances are shown in FIG. 16. The gain and phase mismatches from 20-30 GHz are 1.8 dB and 12°, respectively. However, the gain mismatch can reach 5.5 dB at 35 GHz. The measurements of the 1-dB power compression points (P1 $dB_{21}$ P1 $dB_{31}$) and the input referred third order intercept points ($IIP3_{21}$ and $IIP3_{31}$) for both channels for the frequency range of 22-35 GHz are shown in FIG. 17.

P1 dB and IIP3 higher than −14.8 and −6 dBm across 22-35 GHz are achieved for both channels, respectively. The performance of the proposed wideband balun-LNA is shown in Table I in comparison with other LNA designs operating in the same frequency spectrum. These results confirm that the balun-LNA exhibits good differential property, high power gain, low noise figure, very competitive linearity, and the lowest power consumption in the K/Ka-band of operation.

A wideband 22-35 GHz balun-LNA embodiment is implemented using -18 µm. SiGe BiCMOS technology. The balun-LNA structure implemented new linearity technique based on Gm-constant approach and utilized coupling staked transformer to improve power and noise efficiency. Analytical expressions for the wideband input matching impedance, linearity, noise figure, and stability were developed to highlight the design tradeoffs. The gain and phase mismatches for the frequency range of 20-30 GHz are 1.8 dB and 12° respectively. Power gains of 15.6 and 15.4 dB, 3-dB bandwidths of 7.6 GHz and 11.5 GHz, noise figures of 4.5-5.8 and 4.6-7.09 dB, and linearity better than -6.07 dBm are achieved between the input and two outputs. The balun-LNA consumes only 5 mA dc current from 1.8V supply and having an active area of 0.46 mm².

Noise Analysis Basis

The noise analysis presented below is based on the noise model shown in FIG. 6. Before determining the input referred voltage noise due to the base and collector shot currents of transistors $Q_1$, $Q_2$, we had to solve various circuits' impedances affected by the transformer behavior. From the noise model, $Z_x$ is the impedance looking from the base of transistor $Q_2$ into the transformer. Similarly, $Z_c$ is the impedance at the collector of $Q_1$. $Z_M$ is the impedance due to Miller effect at transistor $Q_1$. Further, $Z_e$, and $Z_s$ are the impedances looking at the emitter and from the base into the source generator of $Q_1$, respectively. Applying KCL analysis yields Eqs. (A1)-(A5) as follows.

$$Z_x \approx Z_2 \| \left[ R_{bx2} + sL_{b2} + \frac{(Kn)sL_{e1}(sL_{b2} + Z_1 + Z_2)(sC_{be} + g_{m1})}{g_{m1}Z_1 - (Kn)sL_{e1}(sC_{be} + g_{m1})} + Z_1 \right] \quad (A1)$$

where $Z_1$, $Z_2$ are defined earlier.

$$Z_c \approx Z_1 \| \left[ sL_{b2} + \frac{(Kn)sL_{e1}(sL_{b2} + Z_1 + Z_2)(sC_{be} + g_{m1})}{g_{m1}Z_1 - (Kn)sL_{e1}(sC_{be} + g_{m1})} + Z_2 \right] \quad (A2)$$

$$Z_\mu \approx [Z_c] + \left(\frac{1}{sC_{bc}}\right) \quad (A3)$$

$$Z_M \approx \left(\frac{Z_\mu}{(1-A_v)}\right)$$

Where A is the voltage gain of the balun-LNA.

$$Z_e \approx sL_{e1}\left[1 + \frac{(Kn)(g_{m1}Z_1 - (Kn)sL_{e1}(sC_{be} + g_{m1}))}{(sL_{b2} + Z_z + Z_2)(sC_{be} + g_{m1})}\right] \quad (A4)$$

$$Z_s \approx \left|\left(R_{bx} + R_{L_b} + sL_b + \left(\frac{R_s}{sC_{pad}R_s + 1}\right)\right)\right| \quad (A5)$$

The base and collector current shot noises for transistors $Q_1$, $Q_2$ are given by:

$$\sqrt{\overline{i^2_{n,b1,2}}} = 2qI_{B1,2} \quad (A6)$$

$$\sqrt{\overline{i^2_{n,c1,2}}} = 2qI_{C1,2} \quad (A7)$$

where q is the electron charge constant, and $I_{B1,2}$ and $I_{C1,2}$ are the collector and base currents for transistors $Q_1$, $Q_2$, respectively.

The input referred voltage noise due to the base and collector currents shot noises of transistors $Q_1$ and $Q_2$ including the parasitic base resistance $R_{bx2}$ are shown in (A8)-(A12) where β is the current gain of $Q_1$ and $Q_2$.

$$\sqrt{\frac{\overline{v^2_{ni,Q1}}}{\overline{i^2_{n,c1}}}} \approx \left|\left[1 - \frac{Z_e}{Z_e + \left(\frac{r_e}{sC_{be}r_e + 1}\right)\left(\frac{1}{\beta}\right)\left(\frac{Z_M Z_s}{Z_M + Z_s}\right)}\right]\frac{1}{g_{m1}}\right|^2 \quad (A8)$$

$$\sqrt{\frac{\overline{v^2_{ni,Q1}}}{\overline{i^2_{n,b1}}}} \approx \left|\frac{\left(\frac{Z_M Z_s}{Z_M + Z_s}\right)\|\left(\left(\frac{\beta r_e}{sC_{be}\beta r_e + 1}\right) + \beta Z_e\right) +}{Z_e + \left(\frac{r_e}{sC_{be}r_e + 1}\right) + \left(\frac{1}{\beta}\right)\left(\left(\frac{Z_M Z_s}{Z_M + Z_s}\right)\right)}\frac{1}{g_{m1}}\right|^2 \quad (A9)$$

$$\sqrt{\frac{\overline{v^2_{ni,Q2}}}{R^2_{bx2}}} \approx \left|\left[\frac{Z_2}{Z_2 + Z_x}\right]\left[\frac{1}{\left(\frac{g_{m1}}{g_{m3}} + nK\right)}\right]\right|^2 \quad (A10)$$

$$\sqrt{\frac{\overline{v^2_{ni,Q2}}}{\overline{i^2_{n,b2}}}} \approx \left|\left[\left(\frac{Z_2 Z_x}{Z_2 + Z_s}\right) + \frac{(R_{L_{e2}} + sL_{e2})}{(R_{L_{e2}} + sL_{e2}) + \left(\frac{r_{e2}}{sC_{be2}r_{e2} + 1}\right) + \left(\frac{1}{\beta}\right)\left(\frac{Z_x}{sC_{p2}Z_x + 1}\right)}\right]\left[\frac{1}{\frac{g_{m1}}{g_{m3}} + nK}\right]\right|^2 \quad (A11)$$

$$\sqrt{\frac{\overline{v^2_{ni,Q2}}}{\overline{i^2_{n,e2}}}} \approx \left|\left[1 - \left[\frac{R_{L_{e2}} + sL_{e2}}{\left(R_{L_{e2}} + sL_{e2} + \left(\frac{r_{e2}}{sC_{be2}r_{e2} + 1}\right)\right) + \left(\frac{1}{\beta}\right)\left(\frac{(R_{bx2} + Z_x)}{sC_{p2}(R_{bx2} + Z_x) + 1}\right)}\right]\right] \cdot \left[\frac{1}{\frac{g_{m1}}{g_{m3}} + nK}\right]\right|^2 \quad (A12)$$

Now, taking the outcomes from (A8)-(A12) and normalize it to the source generator impedance $R_s$ results in (A13)-(A17). $\psi_1(\omega)$-$\psi_5(\omega)$ is the total equivalent input referred voltage noise power shown in (14).

$$\Psi_1(\omega) \approx \frac{1}{2R_s}\left\|1 - \frac{Z_e}{Z_e + \left(\frac{r_e}{sC_{be}r_e + 1}\right) + \left(\frac{1}{\beta}\right)\left(\frac{Z_M Z_s}{Z_M + Z_s}\right)}\right\|^2 \quad \text{(A13)}$$

$$\Psi_2(\omega) \approx \frac{1}{2\beta R_s}\left|\frac{\left(\frac{Z_M Z_s}{Z_M + Z_s}\right)\|\left(\left(\frac{\beta r_e}{sC_{be}\beta r_e + 1}\right) + \beta Z_e\right)) +}{Z_e + \left(\frac{r_e}{sC_{be}r_e + 1}\right) + \left(\frac{1}{\beta}\right)\left(\left(\frac{Z_M Z_s}{Z_M + Z_s}\right)\right)}\right|^2 \quad \text{(A14)}$$

$$\Psi_3(\omega) \approx \frac{R_{bx2}\left\|\frac{Z_2}{Z_2 + Z_x}\right\|^2}{R_s} \quad \text{(A15)}$$

$$\Psi_4(\omega) \approx \frac{1}{2\beta^2 R_s}\left\|\left(\frac{Z_2 Z_x}{Z_2 + Z_x}\right) + \frac{(R_{L_{e2}} + sL_{e2})}{(R_{L_{e2}} + sL_{e2}) + \left(\frac{r_{e2}}{sC_{be2}r_{e2} + 1}\right) + \left(\frac{1}{\beta}\right)\left(\frac{Z_x}{sC_{p2}Z_x + 1}\right)}\right\|^2 \quad \text{(A16)}$$

$$\Psi_5(\omega) \approx \frac{1}{2\beta^2 R_s}\left\|1 - \left[\frac{R_{L_{e2}} + sL_{e2}}{\left(R_{L_{e2}} + sL_{e2} + \left(\frac{r_{e2}}{sC_{br2}r_{e2} + 1}\right)\right) + \left(\frac{1}{\beta}\right)\left(\frac{(R_{bx2} + Z_3)}{sC_{p2}(R_{bx2} + Z_2) + 1}\right)}\right]\right\|^2 \quad \text{(A17)}$$

Further Embodiments

With the ever growing consumers' demands for high data rate wireless communications, bandwidth, and radar sensor devices are the main surge in the semiconductor market industry. Due to overcrowding on the lower frequency spectrum, the Federal Communications Commission (FCC) has standardized unlicensed microwave and millimeter-wave frequencies to serve the need [26]-[27]. To improve spectrum efficiency, the FCC authorizes the ultra-wideband devices (UWB) to operate concurrently in coexistence with radio astronomy from 23.6-24 GHz, industrial-scientific-medical (ISM) from 24.05-24.25 GHz, IEEE 802.16 standard for wireless metropolitan area network (WiMAN) ranging from 10-66 GHz, short-range and long-range vehicular radar sensors for collision avoidance from 22-29 GHz and from 77-81 GHz, and military radar sensor for unmanned aerial vehicle (UAV) at 35-37 GHz [3]. This frequency spectrum allocation dilemma stems from the fact that these UWB devices operate not only in coexistence with already standardized adjacent bands, but it overlaps them. For that reason, the FCC regulates the effective isotropic radiated power (EIRP) for the UWB devices to limit the interferences on the spectrum [26]-[27]. Transceivers targeting microwave and mm-wave applications are reported with limited agility using single-band approach [29]-[37], dual-band design [38]-[39], and lastly wideband RF front-end receivers [40]-[42].

Dedicated transceivers aiming for microwave and mm-wave specific applications have come to light in recent years. A 0.18-μm 24 GHz CMOS RF front end was reported in [29]. An automotive short-range and long-range radar sensor for Ka- and W-bands application with its FCC regulations was addressed in [30]-[31]. Various broadband architectural transceivers designs for the 60 GHz wireless communications are reported in [32]-[34]. Such receivers with single-balanced RF mixers tend to suffer from local oscillator (LO) leakage, thus causing receiver desensitization. Fully integrated using 4 and 8 elements phased array receivers in CMOS for 24 GHz ISM band are reported in [35]-[16]. Further, a fully integrated 77 GHz BiCMOS phased array receiver with dipole antenna on chip for long-range automotive radar sensor is reported in [37].

To increase versatility and functionality, dual-band transceivers/receivers are demonstrated in [38]-[39]. Adding more passive components to achieve dual-bands resonance introduces high signal loss and increases chip area; hence, increases the power consumption. The dual-bands 24/31 GHz based sub-harmonic receiver architecture in [38] requires fine tuning for the quadrature phases generation schemes as well for amplitude mismatches to improve bands rejection. An automotive dual-bands direct conversion transceiver for collision avoidance is reported in [39]. The large frequency spread of the transceiver frequency planning causes two dedicated local oscillators running at 22 and 77 GHz to be integrated on chip. The drawback is more power consumption, larger chip area, and more complex layout floor planning not to mention the phase noise issues. As we can see; single-band or dual-bands transceivers have limited flexibility. More desired approach targets multi-standards multi-bands using wideband RF front-end transceivers to increase functionality suffers from limited linearity [40]-[42].

A further embodiment for a wideband direct conversion current mode receiver for concurrently coexistent multi-standards multi-bands mm-wave applications is discussed. The receiver consists of a main path correlating the down converted output current gain stages into low input impedance of a trans-impedance amplifier (TIA) with a built-in feed-forward high-pass anti-aliasing blockers filter; no RF voltage gain. In addition, the auxiliary path utilizes an attenuator first block providing robustness to high power jamming UAV radar signals from 35-37 GHz. The architectural receiver design concept is similar to [43]-[48] where current mode gain is maintained throughout the receiver RF front-end. However, passive mixer increases the noise figure of the receiver chain, thus a second gain stage is needed. A class AB amplifier with low input impedance is added without limiting the receiver linearity. Consequently, the class AB amplifier gain stage immunes the receiver from I/Q interaction due to passive mixer 50% duty cycle [50]. The direct conversion receiver is targeted to down convert all IEEE standards within 22-44 GHz spectrum with 500 MHz baseband frequency (IF) bandwidth supporting UWB device applications. The wideband power local oscillator (LO) is provided from; R&S ZVA 67 GHz; vector network analyzer (VNA) with quad power sources and very acceptable phase noise.

Receiver Architecture Using the Low Noise Amplifier

Figure 18:
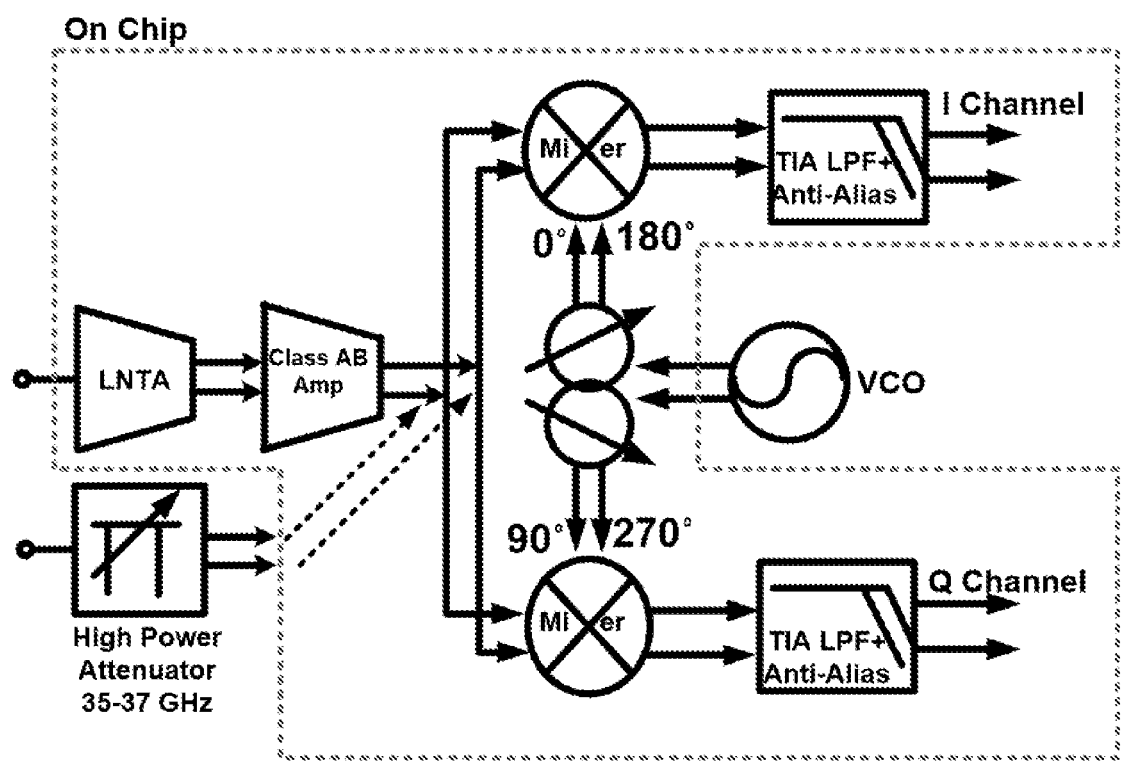
FIG. 18 shows a receiver chain for microwave and mm-wave coexistent applications 22-44 GHz.

A wideband versatile multi-standards multi-bands direct conversion receiver chain for microwave and mm-wave coexistent applications 22-44 GHz is shown in FIG. 18 using 0.18-μm BiCMOS technology.

The receiver architecture consists of a main path; and an auxiliary one dedicated to high power jamming blocker for military unmanned aerial vehicle (UAV) radar application 35-37 GHz. The latter one is designed to have an attenuator first block with linear phase characteristics. A receiver signal strength indicator block (RSSI) senses the incoming antenna signal power level and controls path selectivity. The main path consists of a wideband active balun-LNA reported in [49] followed by a low input impedance class AB amplifier.

The differential current mode outputs of the two successive gain stages are down-converted by an ac coupled doubly-balanced passive mixers through the correlation of differential In-phase/quadrature signals using quadrature all pass filter (QAP) design fed externally from a differential local oscillator (LO). The cross-correlated current output is converted to voltage using a feed-forward trans-impedance amplifier (TIA) with low input impedance. Furthermore; a feed-forward high-pass polyphase filter provides cancellation mechanism at the output TIA node and immune the receiver from out of band interferers (OBI), blockers, and reduce the effect of in-band aliasing. Note that the noise contribution of this high-pass polyphase cancellation filter is minimal owing to its low gain frequency response in band. This design method increases receiver flexibility and functionality and reduces its dependency on external duplexers and bulky MEMS filter as in [38]. Hence, the bill of materials (BOM) is reduced. The proponents of the proposed receiver architecture including both paths are as follows:

1) Utilizing current mode amplification in the RF front-end, no RF voltage gain. Thus, low noise figure (NF) and high in-band linearity for the RF front-end is maintained.
2) Class AB amplifier with low input impedance preceded by a highly linear balun-LNA bolsters the current amplification mode without degrading the linearity compared to [43]; [45]; where regular common source transconductance gm stages are used.
3) Having successive low input impedance throughout the multi-gain stages of the RF front-end helps preserve the wideband operation across the frequency band of interest, and leads to less distortion in the mixer and the nonlinear output impedances of the multi-gain current mode blocks. Hence, the OBIs' experience no voltage gain amplifications and the first voltage gain happens only at baseband after the low pass filter, which provides channel filtering selectivity to mitigate the OBI.
4) Having an active wideband single to differential balun-LNA with asymmetric paths from input to outputs can causes amplitude and phase mismatches due to unequal parasitics between the two paths. To resolve this dilemma; single to differential passive transformer is being used as part of the matching network for a fully differential LNA [47]-[48].

However, a large insertion loss (<−4 dB) due to passive transformer is inevitable and technology dependent. Thus, the noise figure is degraded. The alternative approach is placing a differential class AB gain stage after the balun-LNA to improve the common mode rejection and cancel any mismatches without linearity limitation. Furthermore; the class AB amplifier has built in amplitude and phase mismatches cancellation scheme. The architectural design advantages for this mm-wave receiver are ubiquitous. A more detailed analysis of these benefits is presented below on the circuit implementation level.

Balun-LNA

A single to differential highly linear active wideband balun-LNA is designed to amplify the 22-44 GHz frequency spectrum. The architecture of the active balun-LNA has a wideband input matching network consisting of base inductance; $L_b$; ac coupled transformer between $L_{e1}$ and $L_{b2}$, and coupling parasitic capacitances to the substrate as losses. The input matching response behavior is dependent on the coupling coefficient; K; and the turn ratios between the transformer windings. A resonant frequency shift is adjusted with the base inductance $L_b$. A wideband performance is maintained due to low quality factor of the matching network through its poles and zeros cancellations. Yet, each inductor must have a high quality factor with high self resonance to keep the noise figure low. The output matching network consists of inductive peaking capacitively coupled to the class AB amplifier with low input impedance.

The balun-LNA architecture consists of two paths as follows; a main transconductance gm gain stage path coupled to an auxiliary one using a transformer. The benefits of adding this transformer translates into an increase in the signal to noise ratio (SNR) at the base-emitter junction of the auxiliary path. Hence, a gain boost for less static dc power is achieved. Further; a lower input referred noise is seen in the auxiliary path due to the transformer benefits. The 3-dB differential power gain $S_{21}$ is 15 dB and the bandwidth is limited by the return loss $S_{11}$<−10 dB across the entire frequency band of interest. A linearity improvement technique is based on a constant $G_m$-cell transconductance behavior for the balun-LNA structure. The constant $G_m$-cell transconductance is established through equal emitters' area ($A_e$) ratios and proper base-emitter junction biasing. The constant small signal $G_m$-cell transconductance remains independent of input and output variations under large signal behavior. The proposed structure achieves a second order intermodulation ($IM_2$) cancellation, and the measured input referred third order intermodulation ($IIP_3$) and differential NF are >−1 $dB_m$ and <3.5 dB; respectively. The gain and phase mismatches are kept to a minimum. The total power consumption is less than 18 mW drawn from a 1.8V power supply.

Class AB Amplifier

The class AB amplifier is preceded with a highly linear current mode balun-LNA. Note that to maintain receiver chain linearity and suppress the passive mixer noise contribution; a highly linear second gain stage amplifier is required. Current mode operation in RF front-end entails numerous benefits from noise to linearity; no RF voltage gain [43]-[45]; [47]-[48]. To keep the voltage swing to a minimum at the input of the class AB amplifier; a low differential input impedance has to be maintained across the bandwidth of interest. The input impedance consists of the parallel combination of two sections. The first part is made of the diode connected bipolar device $Q_{2A}$ junction in series with inductor; $L_2$. The second part consists of the common base device QA in series with inductor; $L_1$. The derived input impedance of the class AB amplifier is based on the small signal model.

Equation (1) shows the derived input impedance below;

$$Z_{in,AB}(s) = jwL + \frac{V_T}{I_C + V_T s C_{be}} \quad (1)$$

where we have the assumption $I_{C1}=I_{C2}=I_C$, $L_1=L_2=L$, and $V_T$ is the thermal voltage. We also assumed the devices $Q_{1A}$ and $Q_{2A}$ emitter' area sizes are equal.

Further, the class AB amplifier architecture has a built-in cancelation mechanism for all phases and amplitudes mismatches generated from the asymmetry balun-LNA structure. Although the differential outputs of the balun-LNA are evenly loaded, the input signal asymmetry path to the outputs causes unequal coupling parasitic to the substrate, thus the phase and amplitude mismatches. To resolve this dilemma, the class AB amplifier on a single sided output consists of in-phase input current buffer combined with an out of phase current shifted (180°+α) to average the phase mismatches generated from the balun-LNA and the class AB amplifier. Once measuring the differential signal at the outputs of the class AB amplifier, a complete phase error cancellation is possible in theory. However, the amplitude mismatch error is limited by the class AB amplifier output currents ratios. This partial amplitude error cancellation can limit the phase error cancellation mechanism. Note that the phase and amplitude cancellation mechanism is independent of any passive components and only limited by the active devices mismatches, thus the operation for the error cancellation mechanism is frequency independent and can reach well into the millimeter-wave frequencies. Simulations show phase and amplitude mismatches less than 1.7° and less than 0.5 dB, respectively across 0-45 GHz frequency band.

Passive Mixer and I/Q Generator

We use a simple model of the millimeter-wave direct conversion I/Q receiver front-end using ac coupled fully balanced current-driven quadrature passive mixers with 50% duty cycles. The 2 stages balun-LNA is a transconductor that supplies the RF current modeled by a current source and having load impedance $Z_L(s)$. The second transconductance gain stage is a class AB amplifier with low differential input impedance, thus no RF voltage gain and the receiver linearity is maintained. In addition, the proponents of the ac coupled second gain stage class AB amplifier to the passive mixers are not only limited to the second order intermodulation product improvement, but also help eliminate the I/Q channels crosstalk or interaction due to the lack of reverse isolation between RF and baseband side of the passive mixer. This phenomenon is based on baseband voltage offset produced at the input current buffer impedance; where an antiphase current image is generated from one set of switches to another cause I/Q interaction that affect high and low sides mismatches of gain conversion, linearity (IIP2, IIP3), and noise figure of the current buffer [50]. Then, the major problem with using 50% duty cycle approach has been resolved due to the second class AB gain stage without sacrificing linearity. Furthermore, no dc current is commutating in the deeply trenched dual-well nMOS switches, thus the 1/f noise is greatly reduced at the input current buffer.

The designer has control over the device's size and the LO characteristics. In the passive mixer increasing the device's size width helps reduce the switch on resistance, thus its thermal noise contribution is lower. The dc biasing condition at the drain and source of the CMOS switch is set from the input current buffer impedance. Consequently, the dc bias voltage level of the LO signal is a paramount factor in controlling the switches mode of operation. The characteristics of the LO driver affects the performance of the mixer. Therefore, a large LO signal can help improve the passive mixer conversion gain as well its noise figure. In a 50% duty cycle fully balanced passive mixer, the gain conversion is ideally equal to 2/Tr. However, if the switches of the quadrature passive mixer experience less turn on time than off time then the conversion gain as well as the noise figure are improved at the expense of less linearity.

An in-phase/quadrature phase generator is placed in the LO signal path due to relatively high insertion loss. Alternatively, the QAP can be placed the RF signal path however, the tradeoffs between gain and noise figure are to be considered. The simulations results for QAP in the frequency range 22-44 GHz show an insertion loss of 13 dB with in-phase/quadrature amplitude and phase mismatches less than 1.8 dB and ±3, respectively. The tradeoff is between keeping low insertion loss versus maintaining flat phase response. The total LO power requirement for the passive mixer is 15 dBm using a switch on resistance of 40Ω. From the combination of the LO power signal and the switches sizes, the quadrature passive mixer reaches an acceptable 4 dB noise figure with no power consumption.

TIA with Out of Band Interferes Rejection Filter

A feed-forward trans-impedance amplifier (TIA) also known as open loop TIA is deployed to convert the down converted correlated output current from the in-phase/ quadrature passive mixers into voltages at the differential outputs of the TIA. Furthermore, an auxiliary path uses a feed-forward high pass polyphase filter (HPF) to reject blockers and LO harmonics leakage due to direct conversion receiver architecture. Note the importance of $3^{rd}$ and $5^{th}$ LO harmonics rejection that cause intermodulation with blockers and interferes to down convert to UWB baseband. Also, a buffer for dc interface is implemented to isolate between the TIA input impedance and the active HPF with no phase and amplitude changes. $C_L$, $C_{in}$ are designated as the total load and total input capacitances, respectively. The trans-impedance transfer function is defined as:

$$Z_T(s) = \frac{R_T}{(1+s/\omega_{p1})(1+s/\omega_{p2})} \cdot \left[\left(1 - \left(\frac{s/\omega_{p3}}{s/\omega_{p3}+1}\right)\left(\frac{sgm_2 C_s}{sC_s + gm_2}\right)\right)\right] \quad (2)$$

where $R_T$ is defined as the output impedance of the TIA. Poles $\omega_{p1}=gm_1/C_{in}$ and $\omega_{p2}=1/Z_T C_L$ are designated as the dominant and non-dominant poles for the feed-forward TIA, respectively.

For the open loop TIA and the feed-forward auxiliary cancellation path transconductances, $gm_1$ and $gm_2$ are set equals. The active HPF is preceded by a coarse first order non-evasive HPF with $\omega_{p3}=1/C_{dec} R_{bias}$. The active HPF is established using a capacitively degenerated common source stage. A fourth order HPF is seen at the differential output of the feed-forward TIA. Higher order of the feed-forward cancellation filter can be easily implemented through multi-cascaded HPF stages at the expense of greater in-band noise figure. Note that in the case of desirable reconfigurable bandwidth to support various IEEE standards, the degenerated capacitance at the HPF is bit controlled through an encoder to change its poles and zeros' location so as to maintain the same attenuation factor. Furthermore, the output impedance of the TIA has to incorporate a parallel conductance with variable bias control as to trade the trans-impedance gain for the bandwidth. From simulation results, the trans-impedance gain is 55 dBΩ with 500 MHz bandwidth with no stability issues in accordance with minimum UWB requirements. In addition, the open loop TIA achieves 20 dB attenuations of the third harmonic tone at 1.5 GHz. The total system power consumption is 18.6 mA drawn from a 1.8V supply.

When used in this specification and claims, the terms "comprises" and "comprising" and variations thereof mean that the specified features, steps or integers are included. The terms are not to be interpreted to exclude the presence of other features, steps or components.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

BACKGROUND ART

[1] Federal Communication Commission. FCC, IEEE Std 802.16, 2002
[2] Federal Communication Commission FCC 47 CFR, Section 15.515
[3] M. Eldrich "Ultra-lightweight synthetic aperture radar based on a 35 GHz FMCW sensor concept and online raw data transmission" IEE Proc. Radar Sonar Navig., vol. 153, no 2, April 2006.
[4] Electronic Communication Committee, ECC Report 166, May 2011.
[5] J. Kim, "Wideband Inductorless Balun-LNA Employing Feedback for Low-Power Low-Voltage Application," IEEE Trans. 011 Microwave Theory and Techniques. vol. 60, 110.9, September 2012.
[6] D. Im et. al, "A CMOS Active Feedback Balun-LNA With High IIP2 for Wideband Digital TV Receivers" IEEE Trans. 011 Microwave Theory and Techniques, vol. 58. no. I2, December 2010.
[7] B. Welch, K. T. Kornegay, H. M. Park, and J. Laskar, "A 20-GHz low noise amplifier with active balun in a 0.25-μm SiGe BICMOS technology," IEEE J Solid-State Circuits, vol. 40, no. 10, pp. 2092-2097, October 2005.
[8] Kyung et. al, "K-band Low-Noise Amplifiers using 0.18 um CMOS Technology," IEEE Microwave And Wireless Components Letters, vol. 14,110. 3. March 2004.
[9] V. Jain, S. Sundararaman, and P. Heydari, "A CMOS 22-29 GHz receiver front-end for UWB automotive pulse-radars," IEEE Trans. Mierow. Theory Tech., vol. 57, no. 8, pp. 1903-1914, August 2009.
[10] M. El-Nozahi et. al, "A Millimeter-Wave (23-32 GHz) Wideband BiCMOS Low-Noise Amplifier," IEEE. J. Solid State Circuits, vol. 45, no. 2, February 2010.
[11] Kooho Jung et. al. t'Broadband Active Balun Using Combined Cascade-Cascade Configuration" IEEE TRANSACTIONS ON MICROWAVE THEORY AND TECHNIQUES, vol. 56, no. 8, August 2008.
[12] B. J. Huang, B. J. Huang, K. Y. Lin, and H. Wang, "A 2-40 GHz active balun using 0.13 m CMOS process," IEEE Mierow. Wireless Compon. Lett., vol. 19, no. 3, pp. 164-166, March 2009.
[13] J. R. Long, "Monolithic transformers for silicon RF IC design," IEEE JSolid-State Circuits, vol. 35, pp. 1368-1382, September 2000.
[14] S. C. Blaakmeer, E. A. M. Klumperink, D. M. W. Leenaerts, and B. Nauta, "Wideband Balun-LNA with simultaneous output balancing, noise canceling and distortion-canceling," JSSCC. vol. 43, no. 6, pp. 1341-1350, June 2008.
[15] M. P. van der Heijden, H. C. de Graaff, and L. C. N. de Vreede, "A novel frequency-independent third-order intermodulation distortion cancellation technique for BJT amplifiers," IEEE J Solid-State Circuits, vol. 37, no. 9, September 2002.
[16] B. Gilbert, 'The multi-tanh principle: A tutorial overview," IEEE J Solid-State Circuits, vol. 33, no. I, pp. 2-17, January 1998.
[17] Kuduck Kwon et. al, "A Linearization Technique for a Transconductor Using Vertical Bipolar Junction Transistors in a CMOS Process" IEE.E Trans. on Microwave Theory and Techniques, vol. 61, izo. I. January 2013.
[18] O. Webster, J. Scott, and D. Haigh, "Control of circuit distortion by the derivative superposition method," IEEE Mierow. Guided Wave Lett., vol. 6, no. 3, pp. 123-125, March 1996.
[19] Donggu Im et. al, "A Low Power Broadband Differential Low Noise Amplifier Employing Noise and IM3 Distortion Cancellation for Mobile Broadcast Receivers," IEEE Microwave And Wireless Components letters, vol. 20, 110. JO, October 2010.
[20] M. Parvizi and A. Nabavi, "Improved derivative superposition scheme for simultaneous second- and third-order distortion cancellation in LNAs," IEEE Electronic letters, vol. 45,110.2 5, Dec. 2009.
[21 J X. Li, S. Shekhar, and D. J. Allstot, "Gm-boosted common-gate LNA and differential colpitts VCO/QVCO in 0.18 μm CMOS, IEEE J. Solid-State Circuits, vol. 40, pp 2609-2619, December 2005.
(22) IE3D, HyerLynx 3D EM, Mentor Graphics (Online). Available http://www.mentor.com/pcb/hyperlynx/3d-em/.
(23) SBC18 Design Manual, Jazz Semiconductor, Inc. Newport Beach, Calif., USA.
(24) http:/www.cmicro.com/products/probes/calibration-tools/impedance-substrate/impedance-standard-substrates/.
(25) Marion Edwards, and Jeffrey Sinsky, "A New Criterion for linear 2-Port Stability Using a Single Geometrically Derived Parameter" IEEE Trans. On Microwave Theory and Techniques, vol. 40. No. 12, December 1992.
[26]"First report and order, revision of part 15 of the commission's rules regarding ultra wideband transmission systems," FCC, Washington, D.C., ET Docket 98-153, 2002.
[27]"IEEE Standard for Local and Metropolitan Area Networks, Part 16:Air Interface for Fixed Broadband Wireless Access Systems," IEEE Stan-dard 802.16, 2004.
[28] M. Eldrich "Ultra-lightweight synthetic aperture radar based on a 35 GHz FMCW sensor concept and online raw data transmission" IEE Proc.-Radar Sonar Navig., Vol. 153, No. 2, April 2006.
[29] X. Guan and A. Hajimiri, "A 24-GHz CMOS front-end," IEEEJ. Solid-State Circuits, vol. 39, no. 2, pp. 368-373, February 2004.
[30] E. Ragonese, A. Scuderi, V. Giammello, E. Messina, and G. Palmisano, "A fully integrated 24 GHz UWB radar sensor for automotive applications," IEEE Int. Solid-State Circuits Conf. Dig. Tech. Papers, 2009, pp. 306-307.
[31] S. T. Nicolson, P. Chevalier, B. Sautreuil, and S. P. Voinigescu, "Single-chipW-band SiGe HBT transceivers and receivers for doppler radar and millimeter-wave imaging," IEEE J. Solid-State Circuits, vol. 43, no. 10, pp. 2206-2217, October 2008.

[32] B. Afshar, Y. Wang, and A. Niknejad, "A robust 24 mW 60 GHz receiver in 90 nm standard CMOS," in *Proc. IEEE Int. Solid-State Circuits Conf. Dig.*, February 2008, pp. 182-183.

[33] B. Razavi, "A millimeter-wave CMOS heterodyne receiver with on-chip LO and divider," *IEEE J. Solid-State Circuits*, vol. 43, no. 2, pp. 477-485, February 2008.

[34] B. Floyd, S. Reynolds, U. Pfifer, T. Beukema, J. Gryzb, and C. Haymes, "A silicon 60 GHz receiver and transmitter chipset for broadband communications," in *Proc. IEEE Int. Solid-State Circuits Conf. Dig.*, February 2006, pp. 184-185.

[35] T. Yu and G. M. Rebeiz, "A 22-24 GHz 4-element CMOS phase array with on-chip coupling characterization," *IEEE J. Solid-State Circuits*, vol. 43, no. 9, pp. 2134-2143, September 2008.

[36] X. Guan, H. Hashemi, and A. Hajimiri, "A fully integrated 24-GHz eight-element phased array receiver in silicon," *IEEE J. Solid-State Cir-cuits*, vol. 39, no. 12, pp. 2311-2320, December 2004.

[37] A. Babakkhani, X. Guan, A. Komijani, A. Natarajan, and A. Hajimiri, "A 77 GHz 4-Element phased array receiver with on-chip dipole antenna in silicon," in *Proc. IEEE Int. Solid-State Circuits Conf. Dig.*, December 2006, pp. 180-181.

[38] M. El-Nozahi, A. Amer, E. Sanchez-Sinencio, and K. Entesari, "Amil-limeter-wave (24/31 GHz) dual-band switchable harmonic receiver in 0.18-µm SiGe process," *IEEE Trans. Microw. Theory Techn.*, vol. 58, no. 11, pp. 2717-2730, November 2010.

[39] V. Jain, F. Taeng, and P. Heydari, "A single-chip dual-band 22-29 GHz/77-81 GHz BiCMOS transceiver for automotive radars," inProc. *IEEE Intl. Solid-State Circuits Conf. Dig.*, February 2009, pp. 308-309.

[40] Chun-Hsing Li, Chien-Nan Kuo, and Ming-Ching Kuo, "A 1.2-V 5.2-mW 20-30-GHz Wideband Receiver Front-End in 0.18-µm CMOS" *IEEE TRANSACTIONS ON MICROWAVE THEORY AND TECHNIQUES*, VOL. 60, NO. 11, November 2012.

[41] Yo-Sheng Lin et al., "*Design and Analysis of a* 21-29-GHz Ultra-Wideband Receiver Front-End in 0.18-µm CMOS Technology" *IEEE TRANSACTIONS ON MICROWAVE THEORY AND TECHNIQUES*, VOL. 60, NO. 8, August 2012.

[42] I. Gresham et al., "Ultra-wideband radar sensors for short-range vehicular applications," *IEEE Trans. Microw. Theory Tech.*, vol. 52, no. 9, pp. 2105-2122, September 2004.

[43] R. Bagheri et al., "An 800-MHz 6-GHz software-defined wireless receiver in 90-nm CMOS," *IEEE J. Solid-State Circuits*, vol. 41, pp. 2860-2876, December 2006.

[44] Z. Ru et al., "A software-defined radio receiver architecture robust to out-of-band interference," in *IEEE ISSCC Dig. Tech. Papers*, February 2009, pp. 230-231.

[45] A. Abidi, "The path to the software-defined radio receiver," *IEEE J. Solid-State Circuits*, vol. 42, no. 5, pp. 954-966, May 2007.

[46] C. Andrews and A. Molnar, "A passive-mixer-first receiver with base-band-controlled RF impedance matching, <<6 dB NF, and >>27 dBm wideband IIP3," in *IEEE Int. Solid-State Circuits Conf. (ISSCC) Dig. Tech. Papers*, 2010, pp. 46-47.

[47] H. Darabi, "A blocker filtering technique for SAW-less wireless receivers," *IEEE J. Solid-State Circuits*, vol. 42, no. 12, pp. 2766-2773, December 2007.

[48] Ahmad Mirzaei, Hooman Darabi, Ahmad Yazdi, Zhimin Zhou, Ethan Chang, and Puneet Suri, "A 65 nm CMOS Quad-Band SAW-Less Receiver SoC for GSM/GPRS/EDGE," *IEEE JOURNAL OF SOLID-STATE CIRCUITS*, VOL. 46, NO. 4, April 2011.

[49] C. Geha et al., "A Wideband 22-35 GHz Active Balun-LNA for Low Power Millimeter-Wave Applications with IM2 Cancellation," *IEEE Trans. Microw. Theory Tech.*, vol. 61, no. 9, pp. 2105-2122, September 2015.

[50] Ahmad Mirzaei et al., "Analysis and Optimization of Direct-Conversion Receivers With 25% Duty-Cycle Current-Driven Passive Mixers" *IEEE TRANSACTIONS ON CIRCUITS AND SYSTEMS-I: REGULAR PAPERS*, VOL. 57, NO. 9, September 2010.

[51] S. Kim et al., "An Improved Wideband All-Pass I/Q Network for Millimeter-Wave Phase Shifters" IEEE TRANSACTIONS ON MICROWAVE THEORY AND TECHNIQUES, VOL. 60, NO. 11, November 2012.

The invention claimed is:

1. An amplifier for signal amplification, the amplifier comprising:
 a signal input arrangement;
 a signal output arrangement;
 a first transistor;
 a second transistor;
 a first inductor coupled to an emitter of the first transistor;
 a second inductor coupled between a collector of the first transistor and a base of the second transistor, wherein the first inductor and the second inductor are arranged to operate respectively as a first coil of a transformer and a second coil of the transformer; and
 a third transistor, wherein:
 the first, second and third transistors are coupled to one another to form a transconductance cell,
 the transconductance cell is coupled to the signal input arrangement and the signal output arrangement, and
 the transconductance cell is operable to receive a first signal from the signal input arrangement, amplify the first signal and output an amplified first signal to the signal output arrangement.

2. The amplifier of claim 1, wherein the transconductance cell is configured with a collector terminal of the first transistor coupled to a base terminal of the second transistor and an emitter terminal of the third transistor.

3. The amplifier of claim 1, wherein the transformer is configured to perform at least one of increasing the voltage gain of the amplifier and increasing a signal bandwidth of the amplifier.

4. The amplifier of claim 3, wherein the signal input arrangement comprises an impedance matching circuit which is coupled to the first transistor, the impedance matching circuit comprising the first inductor and a third inductor each coupled to a base of the first transistor.

5. The amplifier of claim 1, further comprising:
 a fourth inductor coupled between an emitter of the third transistor and a collector of the first transistor.

6. The amplifier of claim 1, wherein a collector of the second transistor is coupled to the emitter of a fourth transistor, and wherein the first, second, third and fourth transistors are arranged in a common-emitter configuration.

7. The amplifier of claim 1, wherein a base of the third transistor, a base of a fourth transistor and a power supply input are coupled to one another.

8. The amplifier of claim 7, wherein the signal output arrangement comprises:

a first output portion coupled to a collector of the third transistor; and
a second output portion coupled to a collector of the fourth transistor.

9. The amplifier of claim 8, wherein the first output portion includes a first pair of series connected inductors and a first output terminal coupled to the connection between the first pair of inductors, and
wherein the second output portion includes a second pair of series connected inductors and a second output terminal coupled to the connection between the second pair of inductors.

10. The amplifier of claim 9, further comprising:
a first resistor coupled between the first output portion and the power supply input; and
a second resistor coupled between the second output portion and the power supply input.

11. The amplifier of claim 9, wherein the inductance of the first pair of inductors is equal to the inductance of the second pair of inductors.

12. The amplifier of claim 10, wherein the amplifier is configured to be operable with a passive mixer and a trans-impedance amplifier and the signal output arrangement is coupled to a class AB amplifier.

13. The amplifier of claim 1, wherein the first signal comprises at least one signal having a frequency of 22 GHz to 35 GHz.

14. The amplifier of claim 1, wherein the amplifier is constructed using a SiGe BiCMOS process.

15. A method of operating an amplifier including a signal input arrangement, a signal output arrangement, a first transistor, a second transistor, and a third transistor, a first inductor coupled to an emitter of the first transistor, a second inductor coupled between a collector of the first transistor and a base of the second transistor, wherein the first inductor and the second inductor are arranged to operate respectively as a first coil of a transformer and a second coil of the transformer, the method comprising:
receiving, by a transconductance cell, a first signal from the signal input arrangement;
amplifying the first signal; and
outputting an amplified first signal to the signal output arrangement,
wherein the first, second and third transistors are coupled to one another to form the transconductance cell,
the transconductance cell is coupled to the signal input arrangement and the signal output arrangement, and
the transconductance cell is operable to receive a first signal from the signal input arrangement, amplify the first signal and output an amplified first signal to the signal output arrangement.

* * * * *